United States Patent [19]
Yamauchi

[11] Patent Number: 6,166,993
[45] Date of Patent: *Dec. 26, 2000

[54] SYNCHRONOUS SEMICONDUCTOR MEMORY DEVICE

[75] Inventor: Tadaaki Yamauchi, Hyogo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/437,089

[22] Filed: Nov. 9, 1999

[30] Foreign Application Priority Data

Jun. 22, 1999 [JP] Japan .................................. 11-175332

[51] Int. Cl.$^7$ ..................................................... G11C 8/00
[52] U.S. Cl. .................. 365/233.5; 365/194; 365/230.03
[58] Field of Search ...................................... 365/233, 194

[56] References Cited

U.S. PATENT DOCUMENTS 4,841,488   6/1989   Sanada ..................................... 365/233
5,889,728   3/1999   Rezeanu ................................ 365/233.5
6,009,501  12/1999   Manning ................................. 365/233
6,031,788   2/2000   Bando et al. ........................... 365/233

FOREIGN PATENT DOCUMENTS 10-162576   6/1998   Japan .

*Primary Examiner*—Trong Phan
*Attorney, Agent, or Firm*—McDermott, Will & Emery

[57] ABSTRACT

A control signal generator, which decodes external control signals and generates internal control signals, is divided into a synchronous circuit and a timing adjustment circuit. The synchronous circuit includes latch circuits that respond to internal clock signals complementary to each other. It generates, in synchronization with the internal clock signals, state transition signals indicating operating modes. The timing adjustment circuit adjusts timings of the internal control signals with respect to rising or falling edges of these state transition signals. Thus, the design of the control signal generator is simple.

16 Claims, 21 Drawing Sheets

F I G. 4
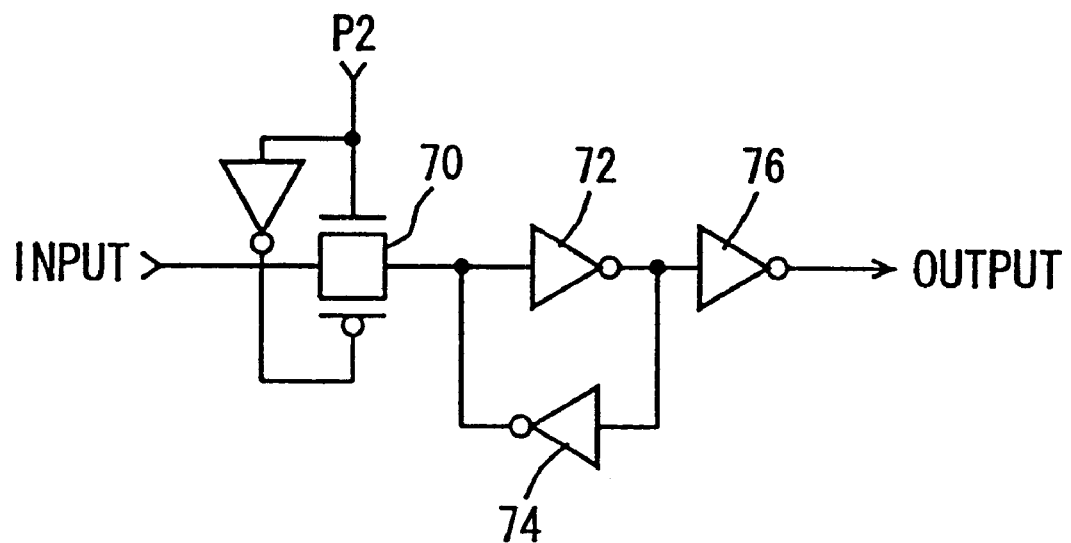

FIG. 12

SYNCHRONOUS SEMICONDUCTOR MEMORY DEVICE

BACKGROUND OF THE INVENTION

1. Field of the Invention

The present invention relates to synchronous semiconductor memory devices, and more particularly to a synchronous semiconductor memory device that receives a plurality of external control signals in synchronization with a clock signal, and makes transition among a plurality of operating states in response to the captured external control signals.

2. Description of the Background Art

Semiconductor memory devices are classified into two types: synchronous semiconductor memory devices that operate in synchronization with a clock signal, and asynchoronous semiconductor memory devices. For example, an asynchronous dynamic random access memory (DRAM) asynchronously captures external control signals, such as a raw address strobe (RAS) signal, a column address strobe (CAS) signal, and a write enable (WE) signal, as commands indicating operating modes. A control signal generator included in the DRAM uses an asynchronous S-R flip-flop circuit, a delay circuit, or the like, to generate various kinds of internal control signals according to the commands captured. The internal control signals enable reading data from and writing data to a memory cell array. They include, for example, a row address latch (RAL) signal to latch a row address signal to a row address buffer, a row address enable (RADE) signal to activate a row decoder, a word line enable (WLE) signal to activate a word line driver, a column address latch (CAL) signal to latch a column address signal to a column address buffer, and a column decoder enable (CDE) signal to activate a column decoder.

When RAS signal is activated, RAL signal is activated. With an edge of this RAL signal as a trigger, row-related internal control signals, e.g., RADE and WLE signals, are activated successively. When RAS signal is inactivated, WLE signal is inactivated. With the edge of this WLE signal as a trigger, the row-related internal control signals are inactivated successively.

A synchronous dynamic random access memory (SDRAM) receives external control signals including RAS signal, CAS signal and WE signal, in synchronization with a clock signal. The internal control signals, such as RAL signal, RADE signal and WLE signal, are generated successively, basically in the same manner as in the above asynchronous DRAM.

As explained above, in a conventional control signal generator, the internal control signals are generated successively. This requires a complicated circuit to accurately adjust rising and falling timings of the internal control signals. Therefore, in order to design DRAMs with different memory cell array arrangements, as well as in order to design DRAMs with different operating modes, the configuration of the control signal generators had to be changed extensively. As a result, a considerable time was required to design various kinds of DRAMs.

SUMMARY OF THE INVENTION

An object of the present invention is to provide a synchronous semiconductor memory device having a simplified control signal generator.

Another object of the present invention is to provide a synchronous semiconductor memory device requiring a shorter design term.

According to the present invention, a synchronous semiconductor memory device that receives a plurality of external control signals in synchronization with a clock signal and transits among a plurality of operating states in response to those captured external control signals include: a memory cell array, a read/write circuit, and a control signal generator. The read/write circuit reads data from and writes data to the memory cell array. The control signal generator generates internal control signals for control of the read/write circuit, and supplies them to the read/write circuit. The control signal generator includes a synchronous circuit and a timing adjustment circuit. The synchronous circuit generates, in synchronization with a clock signal, a plurality of state transition signals representing a plurality of operating states, respectively, in response to the external control signals. The timing adjustment circuit generates, asynchronous to a clock signal, the internal control signals in response to the state transition signals.

The control signal generator of the synchronous semiconductor memory device described above is divided into two circuit portions: the synchronous circuit and the timing adjustment circuit, so that the synchronous circuit can independently control transition of the operating states, and the timing adjustment circuit can independently adjust timing of the internal control signals. Therefore, when the configuration of the memory cell array is changed, only the timing adjustment circuit needs to be modified, not the synchronous circuit. This allows simple design of the control signal generator corresponding to a variety of configurations for memory cell arrays. Similarly, when operating states (modes) are changed, only the synchronous circuit needs to be modified, so that the control signal generators can readily be designed corresponding to various operating modes. As a result, it is possible to shorten the design term.

Preferably, the timing adjustment circuit delays rising edges and/or falling edges of the state transition signals to define rising edges and/or falling edges of the internal control signals. Accordingly, the timing adjustment circuit can be configured primarily with delay circuits only, without having to provide latch circuits.

Preferably, the synchronous semiconductor memory device further includes a 2-phase clock generator that generates, in response to a clock signal, first and second clock signals complementary to each other. When the first clock signal goes from the first logic level to the second logic level, the synchronous circuit activates and thus generates one of the state transition signals. When the second clock signal goes from the first logic level to the second logic level, the synchronous circuit activates and thus generates another one of the state transition signals that is delayed behind the one state transition signal by a half cycle of the first and second clock signals.

Further, the timing adjustment circuit preferably includes an OR circuit that generates an internal control signal in response to the one and the another one state transition signals. Accordingly, since the internal control signal is generated in response to the state transition signal that is later by a half cycle, it becomes possible to adjust timing of the internal control signal without a delay circuit having a delay of one half cycle. This reduces the layout area of the timing adjustment circuit.

Alternatively, the timing adjustment circuit may include an AND circuit that generates an internal control signal in response to the first or second clock signal and the another one state transition signal. Accordingly, since the logic level of the another one state transition signal has already been determined before the rise of the clock signal, it is possible to generate the internal control signal immediately after the clock signal rises.

Preferably, the synchronous semiconductor memory device further includes a phase clock generator that generates first and second clock signals complementary to each other in response to a clock signal. The synchronous circuit includes a command decoder and a first latch circuit. The command decoder receives and decodes an external control signal. The first latch circuit latches the signal from the command decoder in response to the second clock signal. Accordingly, the external control signal is decoded during its set-up period. The operating speed can thus be increased.

Further, the command decoder preferably includes an inverter, a transfer gate, and a NAND circuit. The inverter receives one of the external control signals. The transfer gate receives another one of the external control signals. The NAND circuit receives signals output from the inverter and the transfer gate. Accordingly, the external control signals both reach the NAND circuit without a delay time difference.

Preferably, the memory cell array is divided into a plurality of banks. The synchronous circuit further includes a bank decoder, a second latch circuit, a logic circuit, and a third latch circuit. The bank decoder receives and decodes a bank address signal to identify the banks. The second latch circuit latches a signal from the bank decoder in response to the second clock signal. The logic circuit outputs a signal in response to the signals latched at the first and second latch circuits. The third latch circuit latches a signal from the logic circuit in response to the first clock signal.

Accordingly, the bank address signal is decoded by the bank decoder placed before the second latch circuit, and the logic circuit operates the resulting signal along with the signal from the command decoder. Thus, it is possible to reduce the number of logic circuit stages necessary before the second latch circuit. This enables set-up margin to be relaxed, and the number of latch circuits to be reduced.

Preferably, the synchronous circuit includes a first command decoder, a first logic circuit, a second logic circuit, a second command decoder, and a gate circuit. The first command decoder decodes an external control signal. The first logic circuit generates, in response to a signal from the first command decoder, one of the state transition signals that keeps its active state over a plurality of cycles of the clock signal. The second logic circuit generates, in response to the state transition signal from the first logic circuit, a first reset signal for causing the state transition signal to attain an inactive state, and supplies the signal to the first logic circuit. The second command decoder decodes an external control signal, and generates a second reset signal for causing the state transition signal from the first logic circuit to enter an inactive state. The gate circuit is connected between the first and the second logic circuits, and, in response to the second reset signal, renders the state transition signal from the first logic circuit inactive.

Accordingly, in the case where an external control signal is input before a prescribed set-up period is completed, a noise may enter only the second reset signal, but not the first reset signal. Therefore, even if the state transition signal, which should be kept at an active state over a plurality of cycles, is erroneously rendered inactive due to the noise on the second reset signal, the state transition signal will soon recover the normal active state.

Preferably, the synchronous circuit includes a decoder and a comparison circuit. The decoder decodes an external signal. The comparison circuit compares a signal from the decoder with a state transition signal. Accordingly, since the decoded external signal is compared with the state transition signal during the set-up period of the external control signal, it is possible to increase the operating speed.

Preferably, the memory cell array is divided into a plurality of banks. The synchronous circuit includes a bank decoder, a bank column activation circuit, a comparison circuit, a precharge command decoder, and a column termination circuit. The bank decoder decodes a bank address signal to identify the banks. The bank column activation circuit generates, in response to a signal from the bank decoder, a bank column activation signal that indicates a bank, among the plurality of banks, in which a column system is in operation. The comparison circuit compares the signal from the bank decoder with the bank column activation signal. The precharge command decoder decodes an external control signal. The column termination circuit generates, in response to a match signal from the comparison circuit and a signal from the precharge command decoder, a column termination signal to terminate the operation of the column system. Accordingly, since the decoded bank address signal and the bank column activation signal are compared during the set-up period of the external control signal, the operating speed can be improved.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a circuit diagram showing a specific configuration of a respective latch circuit shown in FIG. 3.

FIG. 12 is a circuit diagram showing a specific configuration of a synchronous circuit according to a third embodiment of the present invention.

DESCRIPTION OF THE PREFERRED EMBODIMENTS

Figure 1:
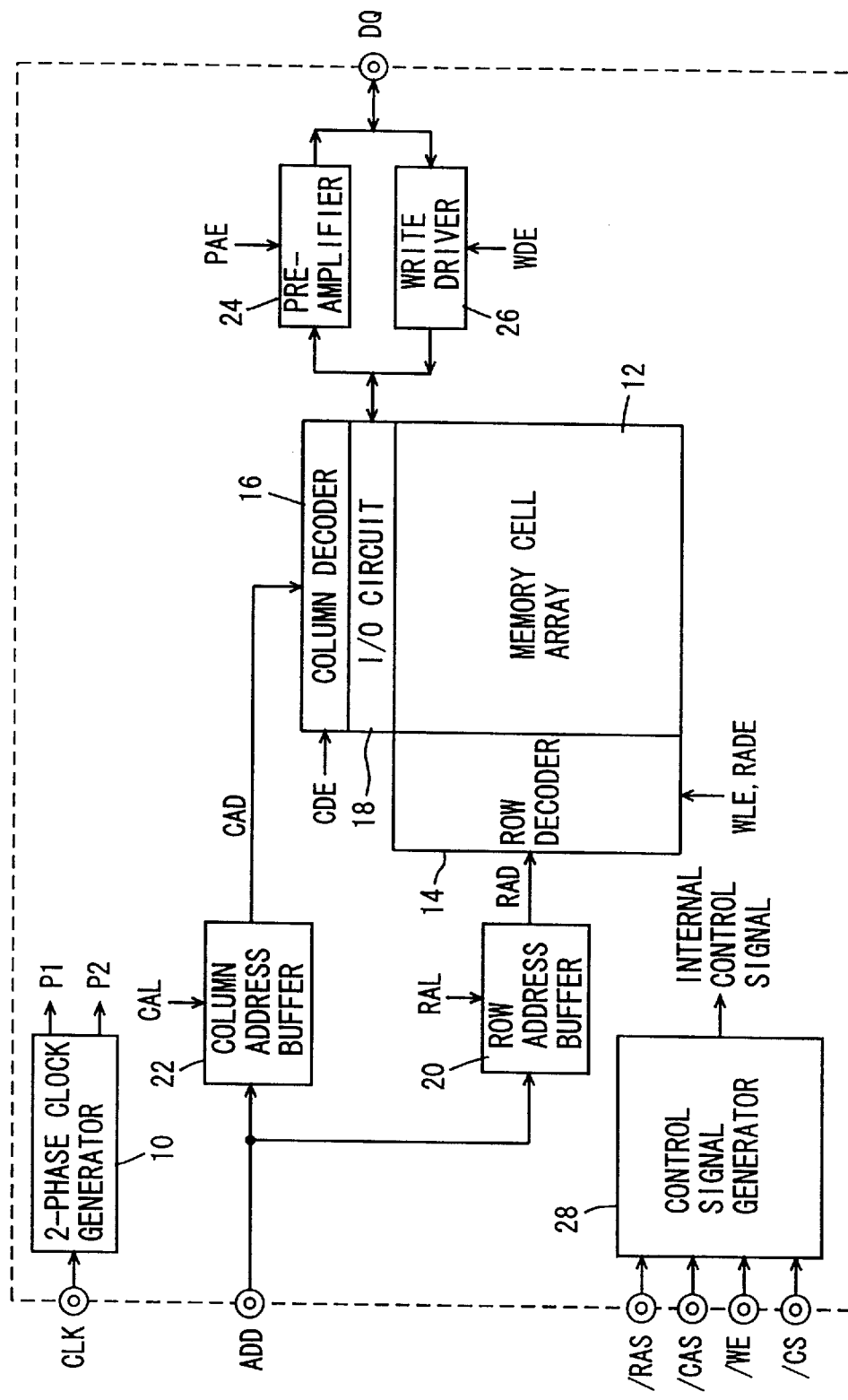
FIG. 1 is a block diagram showing an entire configuration of an SDRAM according to a first embodiment of the present invention.

Hereinafter, embodiments of the present invention will be described in detail with reference to the accompanying drawings, in which same or corresponding portions are denoted by the same reference characters and description thereof will not be repeated.

First Embodiment

Referring to FIG. 1, the synchronous semiconductor memory device according to the first embodiment of the present invention is a synchronous dynamic random access memory (SDRAM) that captures a plurality of external control signals /RAS, /CAS, /WE and /CS in synchronization with an external clock signal CLK, and makes transition among a plurality of operating states (e.g., active mode, precharge mode, read mode, and write mode) in response to the captured external control signals /RAS, /CAS, /WE and /CS. The SDRAM is provided with a 2-phase clock generator 10, a memory cell array 12, a row decoder 14, a column decoder 16, an input and output (I/O) circuit 18, a row address buffer 20, a column address buffer 22, a preamplifier 24, a write driver 26, and a control signal generator 28.

2-phase clock generator 10 generates, in response to an external clock signal CLK, internal clock signals P1 and P2 complementary to each other. Memory cell array 12 is divided into a plurality of (e.g., 4) banks, and includes, as will be described later in detail, a plurality of memory cells arranged in rows and columns, a plurality of word lines arranged in rows, a plurality of bit line pairs arranged in columns, and a plurality of column select lines arranged along the bit line pairs.

Row decoder 14 selectively activates a word line in response to a row address signal RAD. Column decoder 16 selectively activates a column select line in response to a column address signal CAD. I/O circuit 18 includes, as will be described later in detail, an I/O line pair and a plurality of column select gates. In response to the column select line activated by column decoder 16, I/O circuit 18 outputs data from or inputs data to a corresponding bit line pair.

Row address buffer 20 receives an external address signal ADD and supplies row address signal RAD to row decoder 14. Column address buffer 22 receives external address signal ADD and supplies column address signal CAD to column decoder 16.

Preamplifier 24 amplifies a signal read out from memory cell array 12 via I/O circuit 18, and outputs the resulting signal as a data signal DQ. Write driver 26 amplifies the received data signal DQ and writes the resulting signal via I/O circuit 18 to memory cell array 12.

Row decoder 14, column decoder 16, I/O circuit 18, row address buffer 20, column address buffer 22, preamplifier 24 and write driver 26 constitute a read/write circuit that reads data from and writes data to memory cell array 12.

Control signal generator 28 generates, in response to external control signals /RAS, /CAS, /WE and /CS, internal control signals WLE, RADE, CDE, RAL, CAL, PAE and WDE for control of the read/write circuit, and applies them to the read/write circuit.

Figure 2:
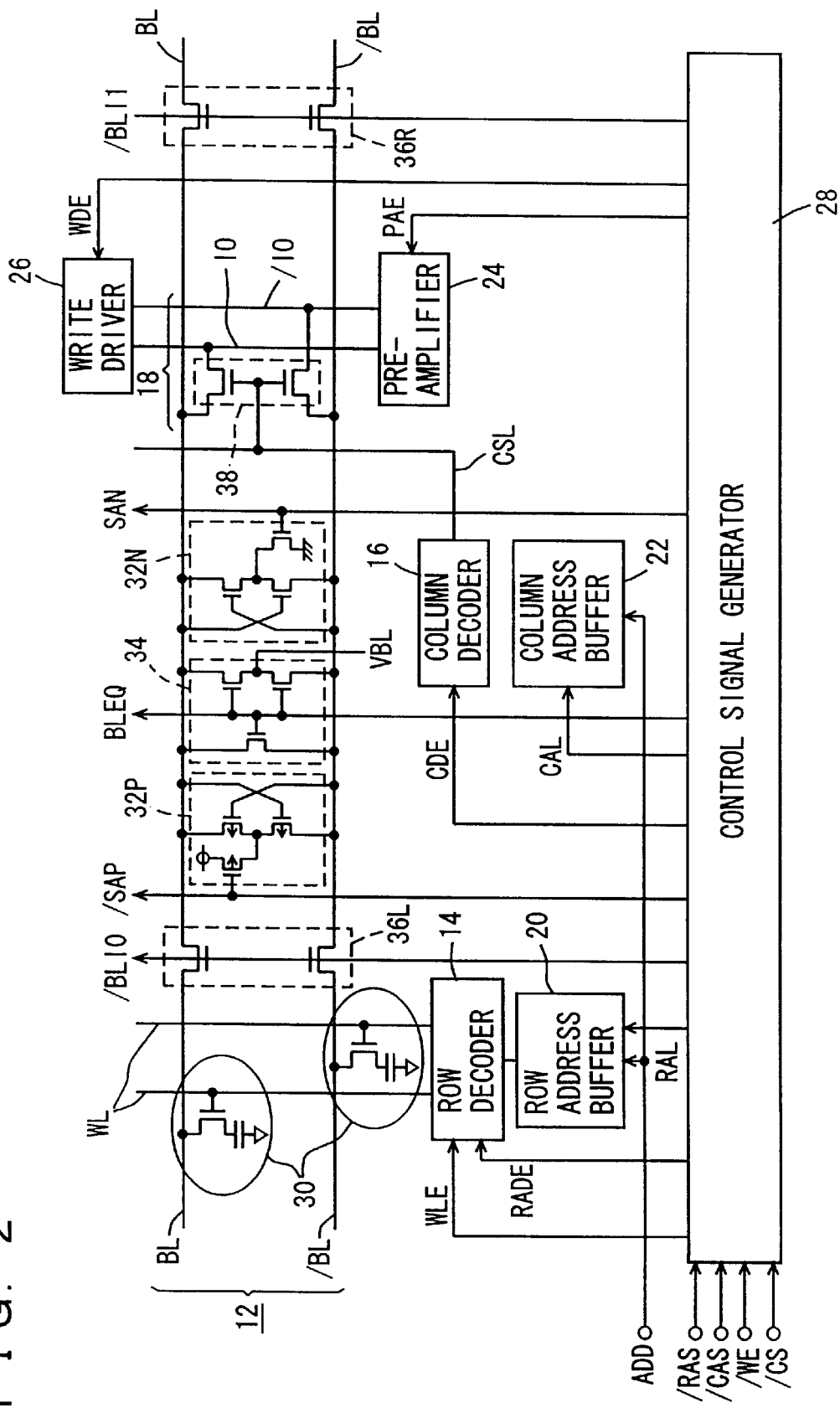
FIG. 2 is a circuit diagram showing a specific configuration of the memory cell array and the I/O circuit shown in FIG. 1.

Referring to FIG. 2, memory cell array 12 includes: a plurality of word lines WL arranged in rows (of which only two word lines are shown representatively in the drawing); a plurality of bit line pairs BL, /BL arranged in columns (of which only one bit line pair is representatively shown in the drawing); a plurality of memory cells 30 arranged at the crossings of word lines WL and bit line pairs BL, /BL (only two memory cells being shown representatively in the drawing); a plurality of column select lines CSL arranged in columns (only one representative column select line shown in the drawing); a plurality of sense amplifiers 32P, 32N amplifying potential differences between bit lines BL and bit lines /BL (only one sense amplifier representatively shown in the drawing); a plurality of precharge circuits 34 precharging and equalizing bit line pairs BL, /BL to an intermediate voltage VBL that is half the power supply voltage (only one precharge circuit shown representatively in the drawing); and a plurality of bit line isolating switches 36L, 36R that selectively connect bit line pairs BL, /BL on the left side and the right side of the drawing to sense amplifiers 32P, 32N at the center of the drawing (only two bit line isolating switches shown representatively in the drawing).

I/O circuit 18 includes an input/output (I/O) line pair IO, /IO commonly provided for the plurality of bit line pairs BL, /BL, and a plurality of column select gates 38 provided corresponding to the plurality of bit line pairs BL, /BL (of which only one column select gate is representatively shown in the drawing). Each column select gate 38 connects, in response to a column select signal received from column decoder 16 via column select line CSL, corresponding bit line pair BL, /BL to I/O line pair IO, /IO.

Of the internal control signals generated by control signal generator 28, a row address latch signal RAL (hereinafter, referred to as "RAL signal") is applied to row address buffer 20. In response to this RAL signal, row address buffer 20 latches an externally supplied row address signal.

Of the internal control signals, a row address enable signal RADE (hereinafter, referred to as "RADE signal") is applied to row decoder 14. In response to the RADE signal, row decoder 14 captures the row address signal RA from row address buffer 20.

Of the internal control signals, a bit line isolating signal /BLI0 (hereinafter, referred to as "/BLI0 signal") is applied to bit line isolating switch 36L. Bit line isolating switch 36L functions to isolate bit line pair BL, /BL when /BLI0 is at an L (logical low) level, and to connect bit line pair BL, /BL when /BLI0 is at an H (logical high) level.

Of the internal control signals, a bit line isolating signal /BLI1 (hereinafter, referred to as "/BLI1 signal") is applied to bit line isolating switch 36R. Bit line isolating switch 36R functions to isolate bit line pair BL, /BL when /BLI1 signal is at the L level, and to connect bit line pair BL, /BL when /BLI1 signal is at the H level.

Of the internal control signals, a bit line equalizing signal BLEQ hereinafter, referred to as "BLEQ signal") is applied to precharge circuit 34. In response to this BLEQ signal, precharge circuit 34 precharges and equalizes bit line pair BL, /BL to intermediate voltage VBL.

Of the internal control signals, a word line enable signal WLE (hereinafter, referred to as "WLE signal") is applied to row decoder 14. In response to WLE signal, row decoder 14 selectively activates word line WL.

Of the internal control signals, a sense amplifier enable signal SAN (hereinafter, referred to as "SAN signal") is applied to an N channel sense amplifier 32N. In response to this SAN signal, N channel sense amplifier 32N reduces the lower voltage on either bit line BL or /BL to a ground voltage level.

Of the internal control signals, a sense amplifier enable signal /SAP (hereinafter, referred to as "/SAP signal") is applied to a P channel sense amplifier 32P. In response to /SAP signal, P channel sense amplifier 32P raises the higher voltage on either bit line BL or /BL to a power supply voltage level.

Of the internal control signals, a column address latch signal CAL (hereinafter, referred to as "CAL signal") is applied to column address buffer 22. In response to this CAL signal, column address buffer 22 latches an externally supplied column address signal.

Of the internal control signals, a column decoder enable signal CDE (hereinafter, referred to as "CDE signal") is applied to column decoder 16. Column decoder 16 is activated in response to this CDE signal.

Of the internal control signals, a preamplifier enable signal PAE (hereinafter, referred to as "PAE signal) is applied to preamplifier 24. Preamplifier 24 is activated in response to PAE signal.

Of the internal control signals, a write driver enable signal WDE (hereinafter, referred to as "WDE signal") is applied to write driver 26. Write driver 26 is activated in response to this WDE signal.

Figure 3:
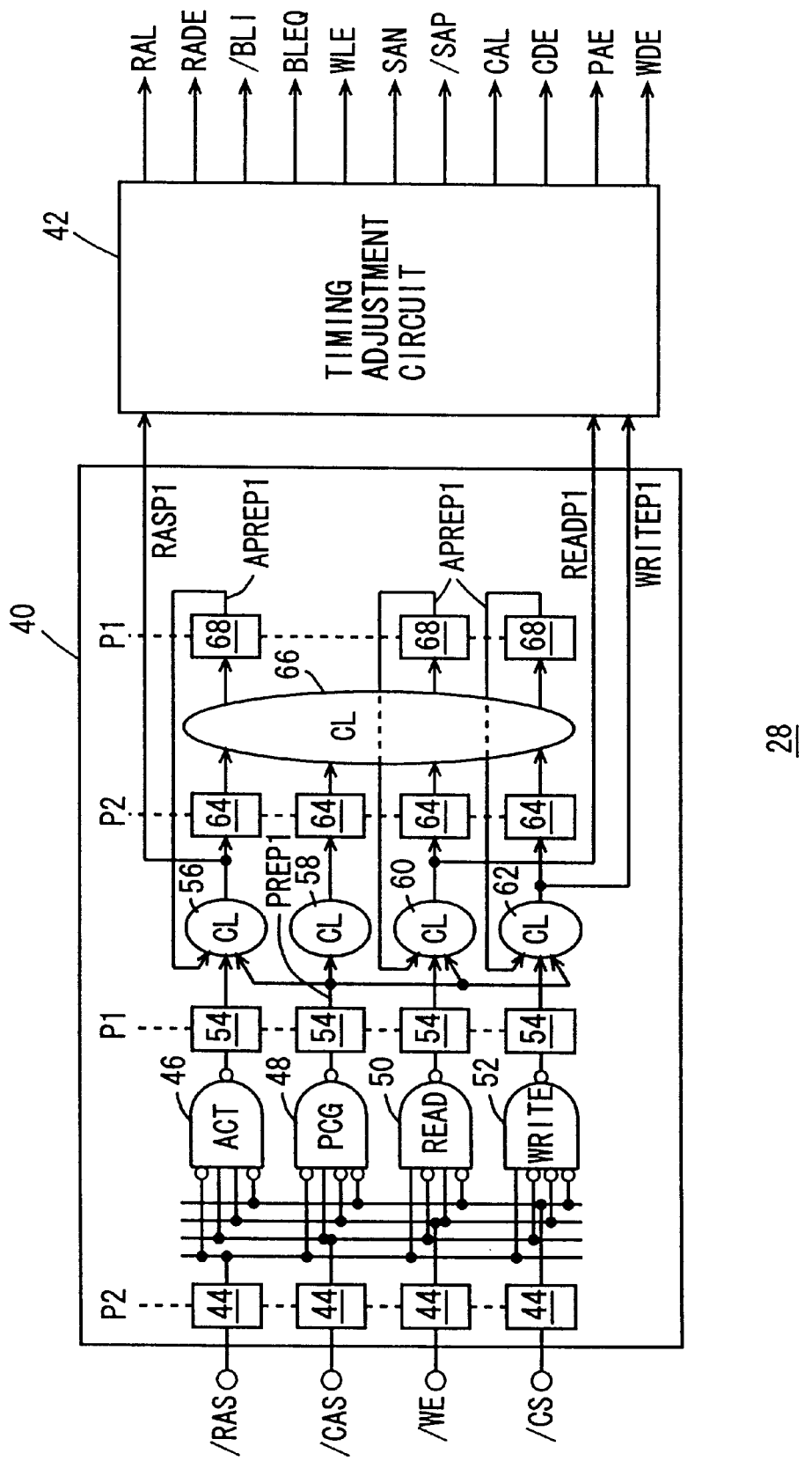
FIG. 3 is a block diagram showing a specific configuration of the control signal generator shown in FIGS. 1 and 2.

As shown in FIG. 3, control signal generator 28 includes: a synchronous circuit 40 that is in synchronization with external clock signal CLK and thus with internal clock signals P1 and P2; and a timing adjustment circuit 42 that is asynchronous to external clock signal CLK and thus to internal clock signals P1 and P2. Synchronous circuit 40 generates, in response to external control signals /RAS, /CAS, /WE and /CS, state transition signals RASP1, READP1 and WRITEP1 that indicate operating states (modes) of this SDRAM. Timing adjustment circuit 42 generates, in response to state transition signals RASP1, READP1 and WRITEP1 from synchronous circuit 40, internal control signals RAL, RADE, /BLI (representing /BLI0 and /BLI1 shown in FIG. 2), BLEQ, WLE, SAN, /SAP, CAL, CDE, PAE, and WDE. Thus, control signal generator 28 is divided into two circuits: synchronous circuit 40 and timing adjustment circuit 42. Synchronous circuit 40 decodes a command that is a combination of external control signals /RAS, /CAS, /WE and /CS, and exclusively controls the transition of operating states. Timing adjustment circuit 42 adjusts only the timings of the internal control signals described above.

The following table 1 shows commands for operating modes to be adopted for this SDRAM.

TABLE 1

|  | ACT | PCG | READ | WRITE | AREF | RAP | WAP |
| --- | --- | --- | --- | --- | --- | --- | --- |
| /RAS | L | L | H | H | L | H | H |
| /CAS | H | H | L | L | L | L | L |
| /WE | H | L | H | L | H | H | L |
| /CS | L | L | L | L | L | L | L |
| ADD[10] | — | — | L | L | — | H | H |

—: Don't Care

For example, to cause this SDRAM to attain an active mode ACT, a row address strobe signal /RAS (hereinafter, referred to as "/RAS signal") at an L level, a column address strobe signal /CAS (hereinafter, "/CAS signal") at an H level, a write enable signal /WE (hereinafter, "/WE signal") at an H level, and a chip select signal /CS (hereinafter, "/CS signal") at an L level are supplied. Decoding this active command ACT, synchronous circuit 40 generates an active state transition signal RASP1 representing the active mode.

To cause the SDRAM to enter a precharge mode PCG, /RAS signal at the L level, /CAS signal at the H level, /WE signal at an L level, and /CS signal at the L level are supplied. Synchronous circuit 40 decodes this precharge command PCG and generates a precharge state transition signal PREP1 indicating the precharge mode.

To cause the SDRAM to enter a read mode READ, /RAS signal at an H level, /CAS signal at an L level, /WE signal at the H level, /CS signal at the L level, and a 10th bit address signal ADD[10] at an L level are supplied. Decoding this read command READ, synchronous circuit 40 generates a read state transition signal READP1 representing the read mode.

To cause the SDRAM to enter a write mode WRITE, /RAS signal at the H level, /CAS signal at the L level, /WE signal at the L level, /CS signal at the L level, and 10th bit address signal ADD[10] at the L level are supplied. Decoding this write command WRITE, synchronous circuit 40 generates a write state transition signal WRITEP1 representing the write mode.

Other than the modes above, RAP represents a read command with auto-precharge, that enables precharging to be performed automatically after a burst read over a plurality of cycles is completed. WAP represents a write command with auto-precharge, that enables precharging to be performed automatically after the completion of a burst write over a plurality of cycles.

More specifically, synchronous circuit 40 includes: a plurality of latch circuits 44 that latch, in response to internal clock signal P2, external control signals /RAS, /CAS, /WE and /CS, respectively; a plurality of command decoders 46, 48, 50 and 52 that decode the signals latched by latch circuits 44; a plurality of latch circuits 54 that latch, in response to internal clock signal P1, decode signals from respective command decoders 46, 48, 50 and 52; combinational logic (CL) circuits 56, 58, 60 and 62 that generate, in response to the decode signals latched by latch circuits 54, state transition signals RASP1, READP1 and WRITEP1, respectively; a plurality of latch circuits 64 that latch, in response to internal clock signal P2, the state transition signals from combinational logic circuits 56, 58, 60 and 62; a combinational logic (CL) circuit 66 that generates, in response to the state transition signals latched by latch circuits 64, reset signals for reset of respective state transition signals RASP1, READP1 and WRITEP1; and a plurality of latch circuits 68 that latch, in response to internal clock signal P1, the reset signals from combinational logic circuit 66. The reset signals latched by latch circuits 68 are fed back to combinational logic circuits 56, 60 and 62, respectively.

Here, command decoder 46 decodes the active command ACT that is a combination of external control signals /RAS, /CAS, /WE and /CS, as shown in Table 1. Command decoder 48 decodes the precharge command PCG that is a combination of external control signals /RAS, /CAS, /WE and /CS as shown in Table 1. Command decoder 50 decodes the read command READ that is formed of a combination of external control signals /RAS, /CAS, /WE and /CS as shown in Table 1. Command decoder 52 decodes the write command WRITE that is formed of a combination of external control signals /RAS, /CAS, /WE and /CS as shown in Table 1.

Combinational logic circuit 56 generates the active state transition signal RASP1 representing the active mode, in response to the decode signal latched by corresponding latch circuit 54. Combinational logic circuit 60 generates the read state transition signal READP1 representing the read mode, in response to the decode signal latched by corresponding latch circuit 54. Combinational logic circuit 62 generates the write state transition signal WRITEP1 representing the write mode, in response to the decode signal latched by corresponding latch circuit 54.

The decode signal from precharge command decoder 48 is latched to corresponding latch circuit 54, and provided as a precharge reset signal PREP1 to respective combinational logic circuits 56, 58, 60 and 62. Combinational logic circuit 56 resets the active state transition signal RASP1 in response to either precharge reset signal PREP1 or an auto-precharge reset signal APREP1. Combinational logic circuit 60 resets the read state transition signal READP1 in response to either precharge reset signal PREP1 or auto-precharge reset signal APREP1. Combinational logic circuit 62 resets the write state transition signal WRITEP1 in response to either precharge reset signal PREP1 or auto-precharge reset signal APREP1.

Each latch circuit 44 includes a CMOS transfer gate 70 and inverters 72, 74 and 76, for example, as shown in FIG. 4. Transfer gate 70 turns on in response to internal clock signal P2, and captures an input signal. Inverters 72 and 74 constitute a latch, which maintains the captured signal. Inverter 76 outputs the signal maintained. Other latch circuits 54, 64 and 68 each have a configuration similar to that of latch circuit 44.

Figure 5:
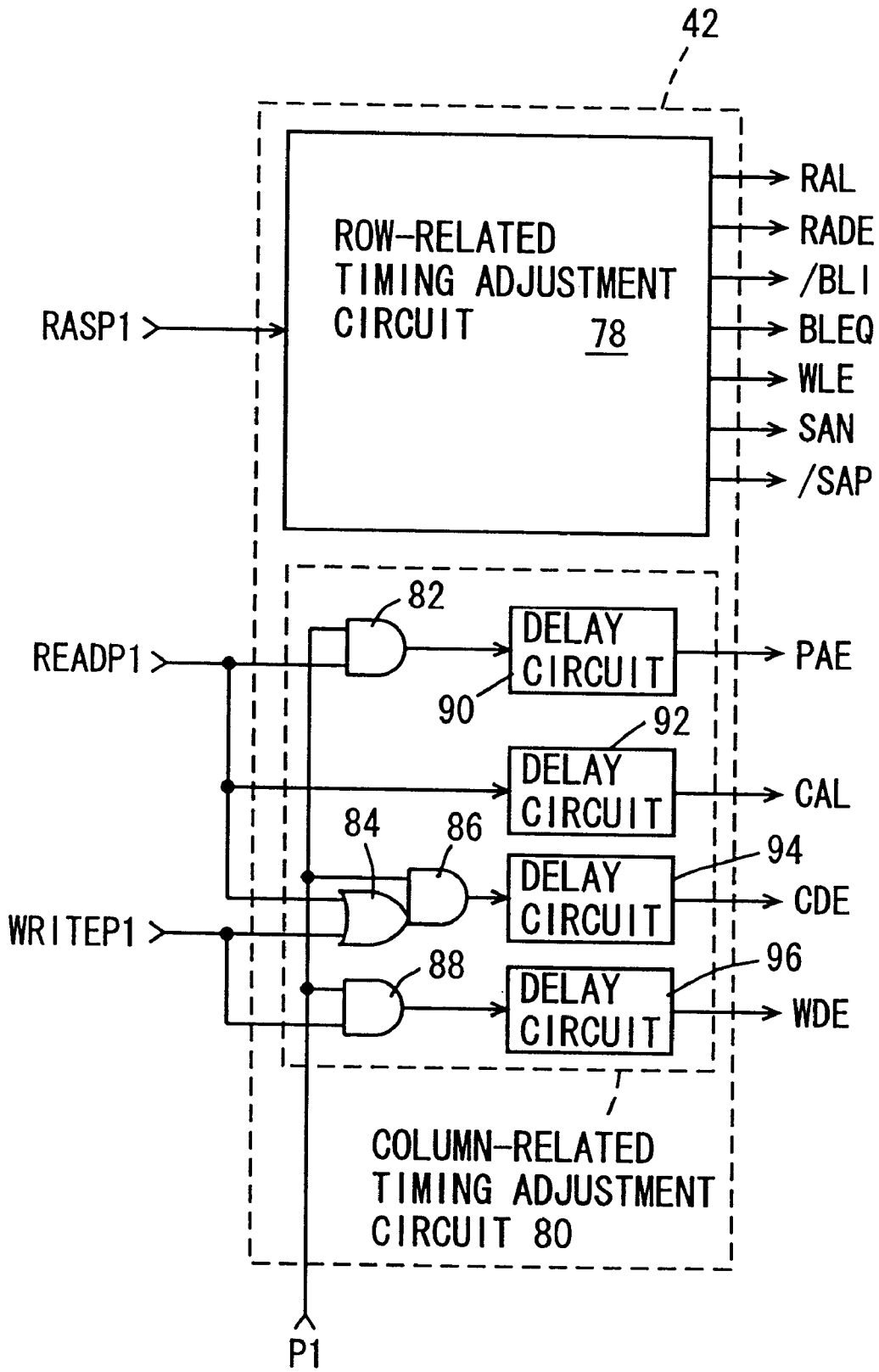
FIG. 5 is a block diagram showing a specific configuration of the timing adjustment circuit shown in FIG. 3.

On the other hand, timing adjustment circuit 42 as shown in FIG. 5 includes: a row-related timing adjustment circuit 78 that generates, in response to active state transition signal RASP1, row-related internal control signals RAL, RADE, /BLI, BLEQ, WLE, SAN and /SAP; and a column-related timing adjustment circuit 80 that generates, in response to read state transition signal READP1 and write state transition signal WRITEP1, column-related internal control signals PAE, CAL, CDE and WDE.

Row-related timing adjustment circuit 78 is basically configured with only a plurality of delay circuits (not shown).

Column-related timing adjustment circuit 80 includes: an AND circuit 82 that receives read state transition signal READP1 and internal clock signal P1; an OR circuit 84 that receives read state transition signal READP1 and write state transition signal WRITEP1; an AND circuit 86 that receives an output signal from OR circuit 84 and internal clock signal P1; an AND circuit 88 that receives write state transition signal WRITEP1 and internal clock signal P1; a delay circuit 90 that delays an output signal from AND circuit 82 and generates PAE signal; a delay circuit 92 that delays read state transition signal READP1 and generates CAL signal; a delay circuit 94 that delays an output signal from AND circuit 86 and generates CDE signal; and a delay circuit 96 that delays an output signal from AND circuit 88 and generates WDE signal. Thus, similar to row-related timing adjustment circuit 78, column-related timing adjustment circuit 80 is basically formed only of a plurality of delay circuits 90, 92, 94 and 96.

Figure 6:
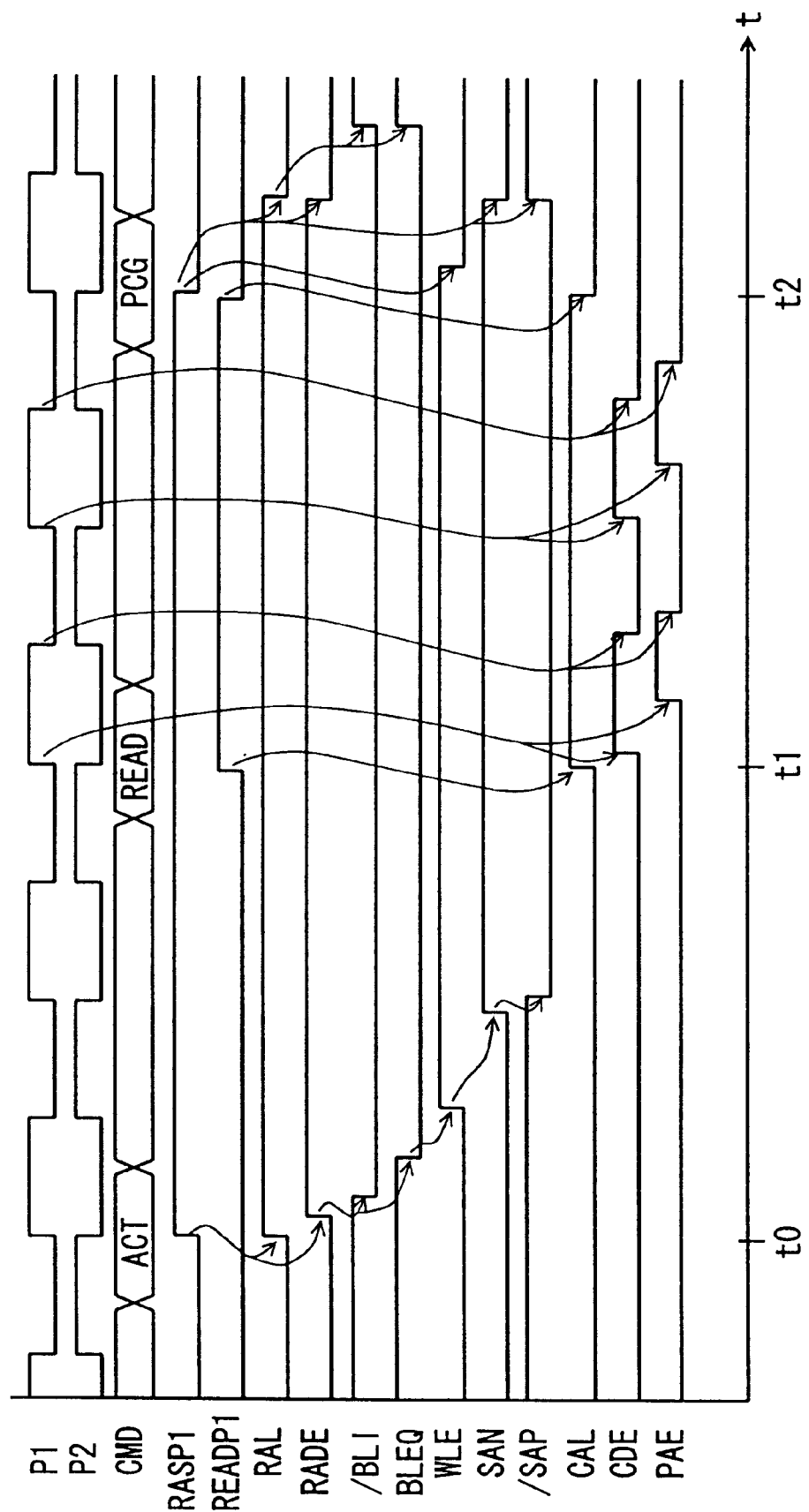
FIG. 6 is a timing diagram illustrating a read operation of the control signal generator shown in FIG. 3.

Hereinafter, the operation of the SDRAM will be described with reference to a timing diagram shown in FIG. 6. Internal clock signal P1 is in phase with external clock CLK, whereas internal clock signal P2 is opposite in phase to external clock CLK.

First, a case is considered where active command ACT is provided as command CMD. In this case, when internal clock signal P1 rises at time t0, the decode signal from act command decoder 46 shown in FIG. 3 is latched to corresponding latch circuit 54. In response to this latched decode signal, active state transition signal RASP1 is generated by combinational logic circuit 56. That is, the signal RASP1 rises to the H level. This active state transition signal RASP1 is held at the H level until time t2 when precharge command PCG is supplied, i.e., over a plurality of cycles (4 cycles in the case of FIG. 6) of internal clock signal P1.

Active state transition signal RASP1 is applied to row-related timing adjustment circuit 78 shown in FIG. 5, and row-related internal control signals RAL, RADE, /BLI, BLEQ, WLE, SAN, and /SAP are generated. More specifically, RAL signal and RADE signal rise in response to the rising edge of active state transition signal RASP1. /BLI signal and BLEQ signal then fall in response to the rising edge of RADE signal. WLE signal rises in response to the falling edge of BLEQ signal. SAN signal rises in response to the rising edge of WLE signal. /SAP signal falls in response to the rising edge of SAN signal. In this way, row-related timing adjustment circuit 78 defines, by delaying the rising edge of active state transition signal RASP1, the rising edges of RAL, RADE, WLE and SAN signals and the falling edges of /BLI, BLEQ and /SAP signals.

On the other hand, in response to the falling edge of active state transition signal RASP1, WLE signal falls, which is followed by the fall of RAL, RADE and SAN signals, and the rise of /SAP signal. Then, in response to the falling edge of RAL signal, /BLI and BLEQ signals rise. Thus, row-related timing adjustment circuit 78 defines, by delaying the falling edge of active state transition signal RASP1, the falling edges of RAL, RADE, WLE and SAN signals and the rising edges of /BLI, BLEQ and /SAP signals.

Next, assume that read command READ is supplied while SDRAM is in the active mode. In this case, when internal clock signal P1 rises at time t1, the decode signal from read command decoder 50 is latched to corresponding latch circuit 54. In response to this decode signal latched, combinational logic circuit 60 generates read state transition signal READP1. That is, the signal READP1 rises to the H level. Read state transition signal READP1 is held at the H level during the burst read period. This READP1 falls to the L level either when auto-precharge reset signal APREP1 is sent from latch circuit 68 of FIG. 3 to combinational logic circuit 60 for automatic precharging at the end of burst read, or when externally supplied precharge command PCG causes precharge reset signal PREP1 to be sent from latch circuit 54 to combinational logic circuit 60. If the read mode has a burst length of "4", for example, read state transition signal READP1 is kept at the H level for 4 cycles of internal clock signal P1 unless precharge command PCG is externally supplied. In FIG. 6, precharge command PCG is supplied during the burst read period, whereby the burst read is forced to interrupt at the second cycle of internal clock signal P1.

This read state transition signal READP1 is supplied to column-related timing adjustment circuit 80 shown in FIG. 5, and column-relate internal control signals CAL, CDE and PAE are generated. More specifically, read state transition signal READP1 is delayed by delay circuit 92, and CAL signal is generated. This CAL signal rises and falls in response to rising and falling edges of read state transition signal READP1, respectively. Delay circuit 92 includes a both delay circuit which delays a rising edge and a falling edge of a signal independently. Delay circuit 92 is therefore possible to set delay for the rising and the falling of the signal, separately.

Read state transition signal READP1 is supplied via OR circuit 84 to AND circuit 86. It is further supplied to delay circuit 94 only while internal clock signal P1 is at the H level, whereby CDE signal is generated. This CDE signal rises and falls corresponding to rising and falling edges of internal clock signal P1.

Read state transition signal READP1 is supplied to delay circuit 90 only while internal clock signal P1 is at the H level, whereby PAE signal is generated. This PAE signal rises and falls corresponding to rising and falling edges of internal clock signal P1.

To define rising and falling edges of the internal control signals described above, timing adjustment circuit 42 includes therein a well-known rise delay circuit that delays only rising edges, a well-known fall delay circuit that delays only falling edges, and a well-known both delay circuit that delays both the rising and falling edges independent of each other.

Figure 7:
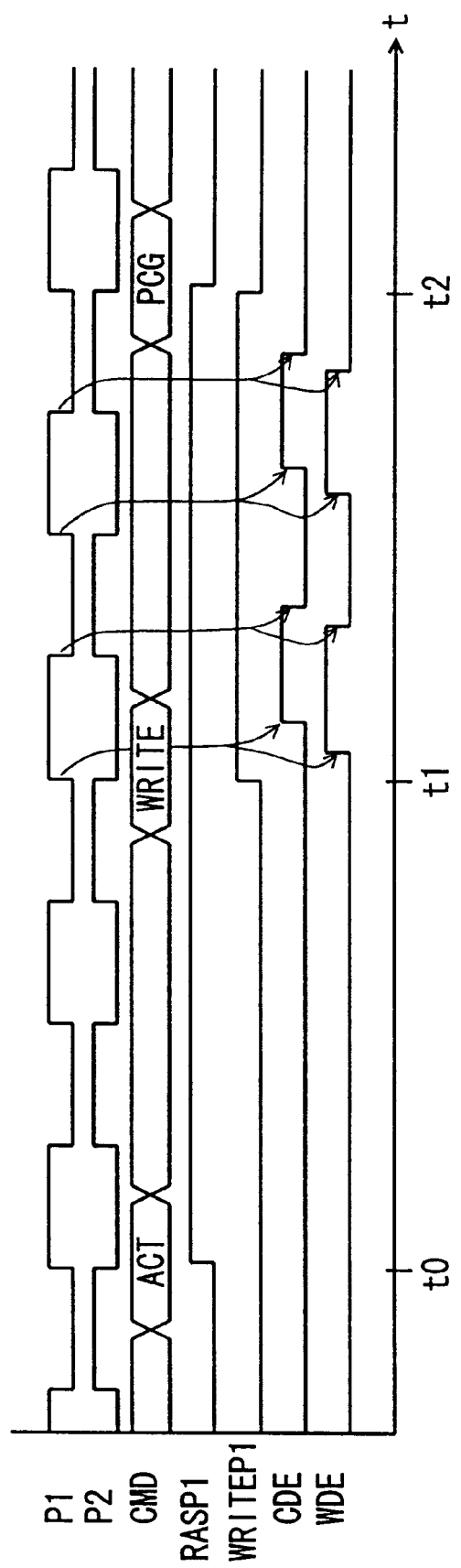
FIG. 7 is a timing diagram illustrating a write operation of the control signal generator shown in FIG. 3.

Now, the case where write command WRITE is supplied while SDRAM is in the active mode will be described with reference to the timing diagram shown in FIG. 7.

In this case, when internal clock signal P1 rises at time t1, the decode signal from write command decoder 52 in FIG. 3 is latched to corresponding latch circuit 54. In response to this latched decode signal, combinational logic circuit 62 generates write state transition signal WRITEP1. That is, the signal WRITEP1 rises to the H level. This write state transition signal WRITEP1 is held at the H level during the burst write period, and as in the case of read state transition signal READP1 described above, it falls to the L level either when auto-precharge reset signal APREP1 is supplied to combinational logic circuit 62 at the end of burst write period, or when the precharge command is externally supplied and thus precharge reset signal PREP1 is supplied to combinational logic circuit 62.

Write state transition signal WRITEP1 is provided to column-related timing adjustment circuit 80 as shown in FIG. 5, and thus, CDE and WDE signals are generated.

More specifically, write state transition signal WRITEP1 is provided to delay circuit 96 only while internal clock signal P1 is at the H level, whereby WDE signal is generated. Thus, WDE signal rises and falls corresponding to the rising and falling edges of internal clock signal P1.

Write state transition signal WRITEP1 is sent to AND circuit 86 via OR circuit 84. It is further sent to delay circuit 94 only while internal clock signal P1 is at the H level, and thus, CDE signal is generated. Thus, CDE signal rises and falls corresponding to the rising and falling edges of internal clock signal P1.

As explained above, according to the first embodiment, control signal generator 26 is divided into synchronous circuit 40 and timing adjustment circuit 42, wherein synchronous circuit 40 generates state transition signals RASP1, READP1, and WRITEP1, whereas timing adjustment circuit 42 adjusts the timings of internal control signals based on these state transition signals RASP1, READP1, and WRITEP1. Therefore, if changes occur in configuration of memory cell array 12 and thus control signal generator 26 must be modified, synchronous circuit 40 does not need any modifications, and only timing adjustment circuit 42 needs to be modified. As a result, it is possible to readily design control signal generator 26 corresponding to a variety of configurations of memory cell array 12. On the other hand, if operating modes are changed and thus control signal generator 26 must be modified, only synchronous circuit 40 needs to be modified, with timing adjustment circuit 42 left unmodified. Accordingly, control signal generator 26 can readily be designed corresponding to different kinds of operating modes.

Although synchronous circuit 40 according to the first embodiment is configured based on latching of the phase clock, it can be configured based on the flip-flop with an edge trigger, alternatively.

Second Embodiment

Figure 8:
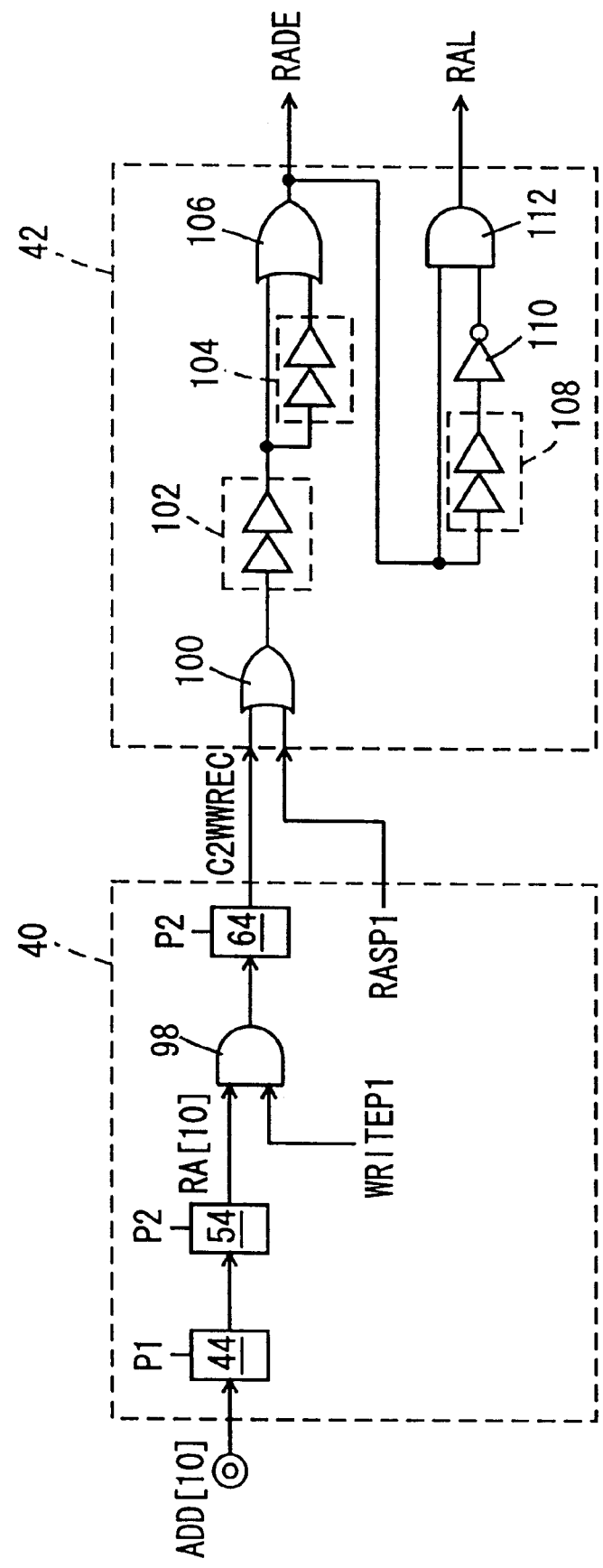
FIG. 8 is a circuit diagram showing a primary configuration of the row system in the control signal generator according to a second embodiment of the present invention.

The SDRAM according to the second embodiment of the present invention will now be described, first in regard to its row system. As shown in FIG. 8, synchronous circuit 40 according to the second embodiment further includes: a latch circuit 44 that latches a 10th bit address signal ADD[10] in response to internal clock signal P2; a latch circuit 54 that latches the latched signal in response to internal clock signal P1; an AND circuit 98 that receives the latched signal (i.e., the 11th bit internal row address signal RA[10]) and write state transition signal WRITEP1 from combinational logic circuit 62 shown in FIG. 3; and a latch circuit 64 that latches an output signal from AND circuit 98 in response to internal clock signal P2. Latch circuit 64 supplies the latched signal to timing adjustment circuit 42 as a state transition signal C2WWREC indicating auto-precharge.

Timing adjustment circuit 42 further includes: an OR circuit 100 that receives auto-precharge state transition signal C2WWREC and active state transition signal RASP1 from synchronous circuit 40; a delay circuit 102; a delay circuit 104; an OR circuit 106 that outputs RADE signal; a delay circuit 108; an inverter 110; and an AND circuit 112 that outputs RAL signal. Here, delay circuits 102, 104 and 108 are both delay circuits that delay both rising and falling edges of respective input signals. Delay circuit 104 and OR circuit 106 constitute a fall delay circuit that delays only a falling edge of the input signal.

Figure 9:
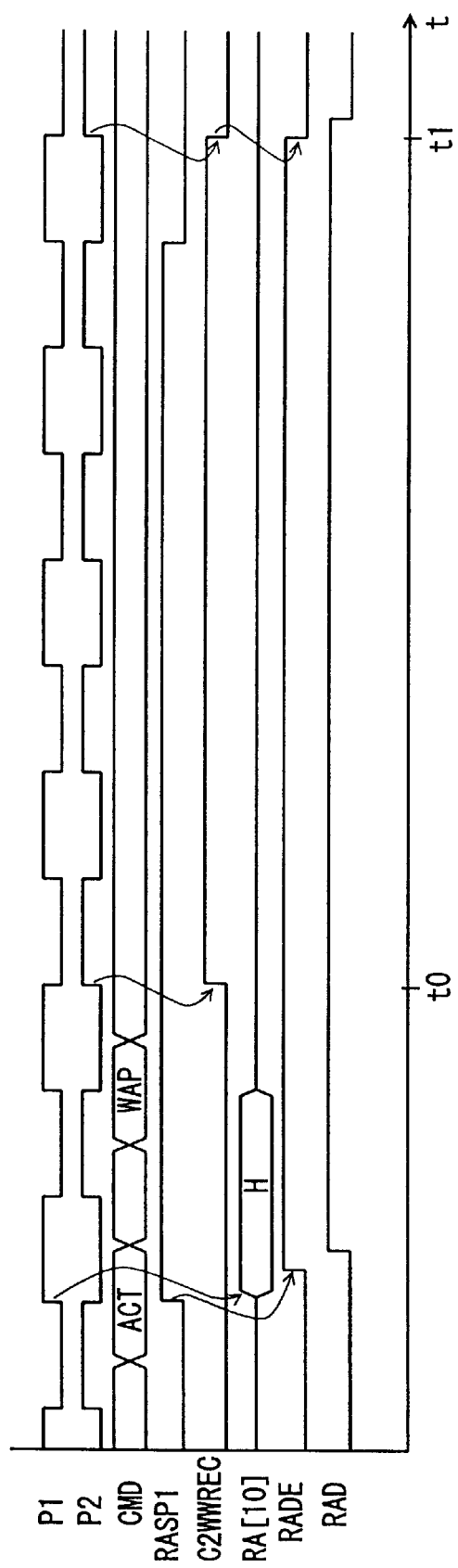
FIG. 9 is a timing diagram illustrating an operation of the control signal generator shown in FIG. 8.

Now, the operation of the control signal generator having the above-described configuration will be described with reference to the timing diagram shown in FIG. 9. Here, the burst length is assumed to be "4".

When auto-precharge write command WAP shown in the previous Table 1 is provided during the active mode period, auto-precharge state transition signal C2WWREC rises to an H level at time t0, a half cycle behind the capturing of command WAP. This auto-precharge state transition signal C2WWREC is held at the H level until time t1, a half cycle behind the end of burst write. RADE signal rises to the H level, behind the rising edge of active state transition signal RASP1 after a delay specified by delay circuit 102. In response to the rising edge of RADE signal, RAL signal rises to and is held at the H level for a prescribed period of time, whereby row address buffer 20 shown in FIGS. 1 and 2 is activated. Row address buffer 20 thus outputs internal row address signal RAD.

At the end of burst write, the automatic precharging operation is to be performed. This precharge needs to be started after the last data is fully written into the memory cell. Therefore, the row-related internal control signals, such as RADE signal, need to fall after the falling of active state transition signal RASP1.

For the row-related internal control signals including RADE signal to fall, for example, a half cycle behind internal clock signal P1, a delay circuit having a delay equivalent to the half cycle must be provided.

According to the present embodiment, however, auto-precharge state transition signal C2WWREC is generated in response to internal clock signal P2. This state transition signal C2WWREC falls a half cycle behind the falling of active state transition signal RASP1. OR circuit 100 causes RADE signal to fall in response to the later falling edge of either active state transition signal RASP1 or auto-precharge state transition signal C2WWREC (in this case, auto-precharge state transition signal C2WWREC).

Therefore, it is unnecessary to provide a delay circuit to ensure that the row-related internal control signals including RADE signal fall a half cycle behind the rising of internal clock signal P1. As a result, the layout area of timing adjustment circuit 42 can be made smaller.

Figure 10:
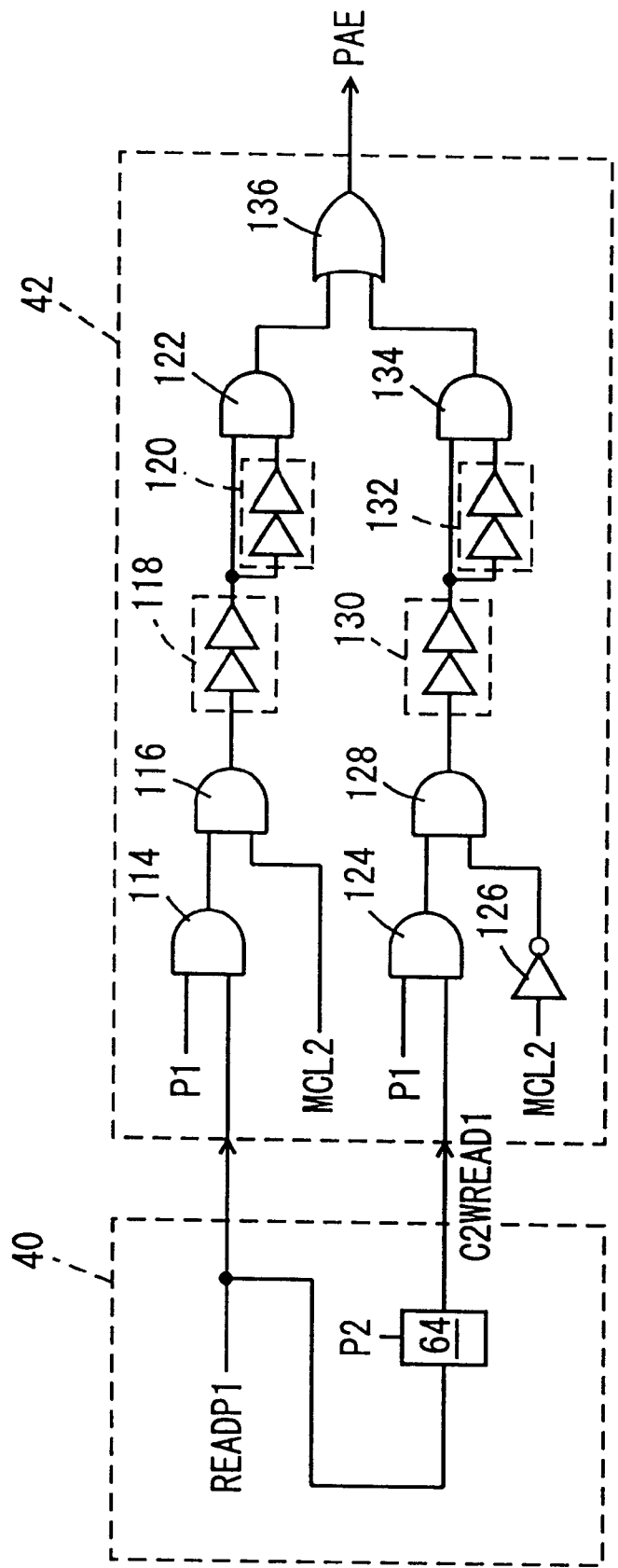
FIG. 10 is a circuit diagram showing a primary configuration of the column system in the control signal generator according to the second embodiment.

Now, in regard to the column system, as shown in FIG. 10, synchronous circuit 40 includes a latch circuit 64 that latches read state transition signal READP1 from combinational logic circuit 60 in response to internal clock signal P2. Latch circuit 64 supplies the latched signal to timing adjustment circuit 42 as state transition signal C2WREAD1.

Timing adjustment circuit 42 includes: an AND circuit 114 that receives internal clock signal P1 and read state transition signal READP1; an AND circuit 116; a delay circuit 118; a delay circuit 120; an AND circuit 122; an AND circuit 124 that receives internal clock signal P1 and state transition signal C2WREAD1 an inverter 126; an AND circuit 128; a delay circuit 130; a delay circuit 132; an AND circuit 134; and an OR circuit 136. A control signal MCL2 indicating a CAS latency is provided to AND circuit 116 and to inverter 126. When the control signal MCL2 is at an H level, the CAS latency is "2", and when control signal MCL2 is at an L level, the CAS latency is "3".

Figure 11:
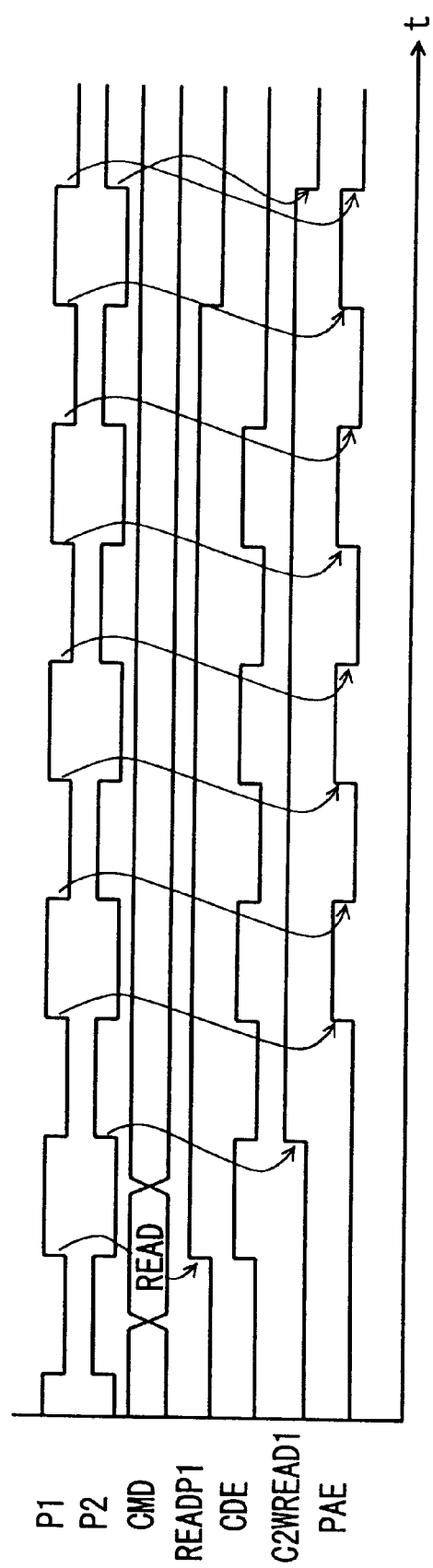
FIG. 11 is a timing diagram illustrating an operation of the control signal generator shown in FIG. 10.

The operation of control signal generator having the above-described configuration will now be described with reference to the timing diagram shown in FIG. 11. Here, the burst length is considered to be "4" and the CAS latency to be "3".

With the CAS latency of "3", the number of pipe line stages increases, and thus, some of the column-related internal control signals, such as PAE signal, are generated one cycle behind the others.

Read state transition signal READP1, which rises in response to the rising edge of internal clock signal P1, is latched at latch circuit 64 in response to internal clock signal P2, and state transition signal C2WREAD1 rises in response to the rising edge of internal clock signal P2. State transition signal C2WREAD1 is thus a half cycle behind state transition signal READP1.

In the case where the CAS latency is "3", control signal MCL2 is at the L level, and thus, AND circuit 122 outputs a signal at the L level constantly. In contrast, AND circuit 134 outputs a signal in response to internal clock signal P1 and state transition signal C2WREAD1. Therefore, OR circuit 136 outputs the output signal from AND circuit 134 as PAE signal.

As in the case of state transition signal READP1, state transition signal C2WREAD1 is held at the H level during the 4-cycle burst read period. During this period, PAE signal rises and falls corresponding to rising and falling edges of internal clock signal P1.

As described above, state transition signal C2WREAD1 is already at the H level before internal clock signal P1 rises. Therefore, it is possible for PAE signal to rise immediately after the rising of internal clock signal P1.

Third Embodiment

Figure 12:
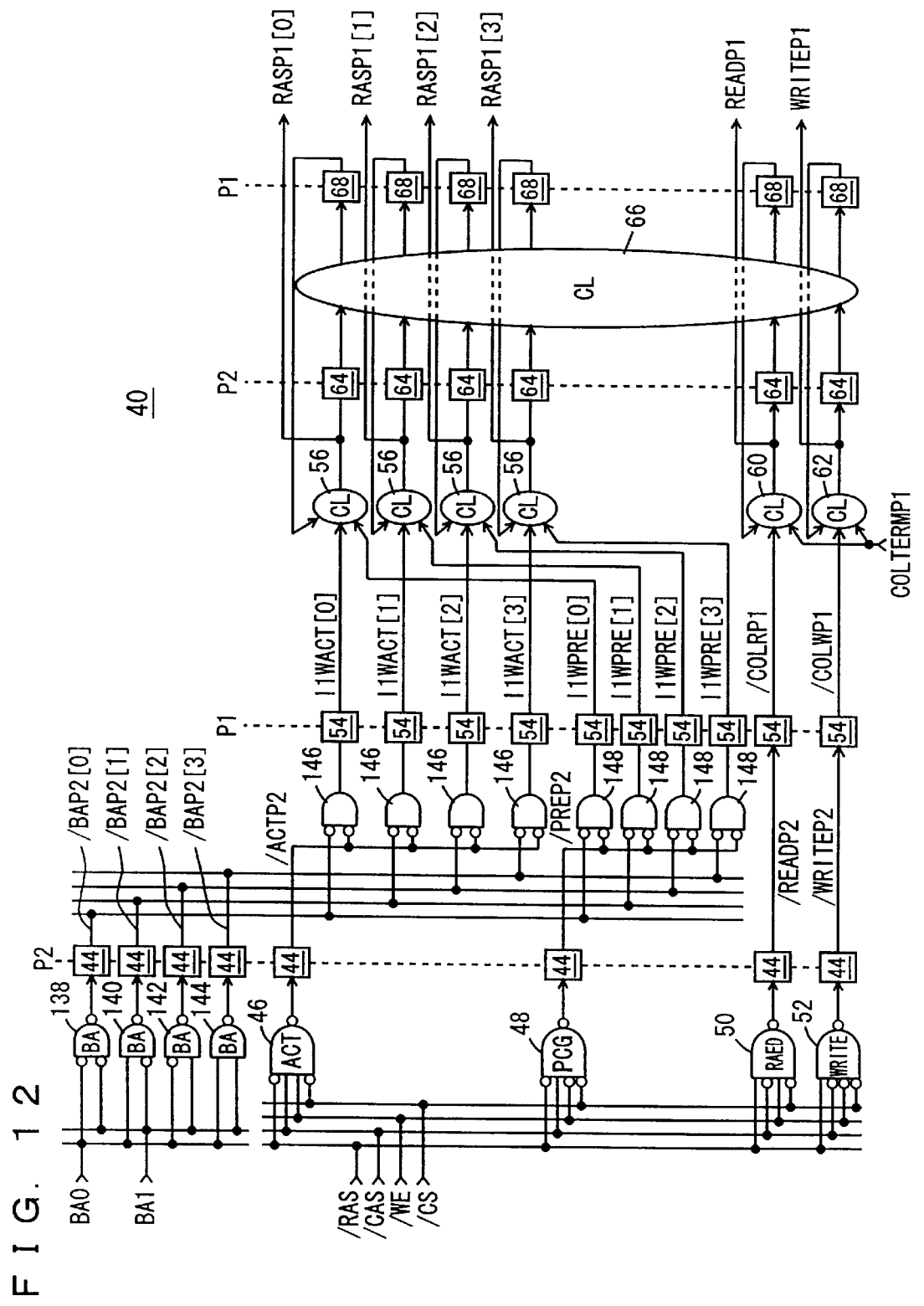

In the synchronous circuit 40 according to the first embodiment as shown in FIG. 3, external control signals /RAS, /CAS, /WE and /CS are first latched in response to internal clock signal P2, and the commands are decoded thereafter. In contrast, as shown in FIG. 12, synchronous circuit 40 according to the third embodiment first decodes the commands of external control signals /RAS, /CAS, /WE and /CS, and then latches the decode signals in response to internal clock signal P2. In general, a set-up period of 1.5 ns to 2 ns is provided for external signals with respect to a clock signal. Thus, by performing logic operations of the external signals within this set-up period, the entire operating speed can be increased.

In synchronous circuit 40 according to the third embodiment, as shown in FIG. 12, command decoders 46, 48, 50 and 52 are provided before respective latch circuits 44. Therefore, command decoders 46, 48, 50 and 52 directly receive external control signals /RAS, /CAS, /WE and /CS, not via the latch circuits. Latch circuits 44 latch decode signals from respective command decoders 46, 48, 50 and 52, in response to internal clock signal P2.

The memory cell array of the SDRAM is divided into four banks. As each bank operates independent of one another, the state transition signals must be generated for each bank.

To selectively activate the four banks, synchronous circuit 40 further includes bank decoders 138, 140, 142 and 144 that decode bank address signals BA0 and BA1. As in the case of the command decoders 46, 48, 50 and 52 described above, bank decoders 138, 140, 142 and 144 are provided before latch circuits 44, and directly receive externally supplied bank address signals BA0, BA1. Latch circuits 44 latch decode signals from bank decoders 138, 140, 142 and 144, in response to internal clock signal P2.

To selectively provide latch circuits 54 with bank decode signals /BAP2 [0] to [3] from latch circuits 44, synchronous circuit 40 further includes four 2-input NOR circuits (negative logic) 146 that commonly receive active decode signal /ACTP2 from latch circuit 44, and four 2-input NOR circuits (negative logic) 148 that commonly receive precharge decode signal /PREP2 from latch circuit 44. Latch circuits 54 latch signals from respective NOR circuits 146 in response to internal clock signal P1. The signals I1WACT [0] to [3] latched at latch circuits 54 are supplied to respective combinational logic circuits 56. Latch circuits 54 latch signals from respective NOR circuits 148 in response to internal clock signal P1. The signals I1WPRE [0] to [3] latched at latch circuits 54 are supplied to respective combinational logic circuits 56. Combinational logic circuits 56 generate active state transition signals RASP1 [0] to [3] in response to signals I1WACT [0] to [3], and cause these active state transition signals RASP1 [0] to [3] to attain an inactive state in response to signals I1WPRE [0] to [3], respectively.

Latch circuit 44 latches a read decode signal from read command decoder 50 in response to internal clock signal P2. Latch circuit 54 latches the read decode signal /READP2 latched at the latch circuit 44 in response to internal clock signal P1, and sends the latched signal to combinational logic circuit 60.

Latch circuit 44 latches a write decode signal from write command decoder 52 in response to internal control signal P2. Latch circuit 54 latches the write decode signal /WRITEP2 latched at the latch circuit 44 in response to internal clock signal P1, and sends the latched signal to combinational logic circuit 62.

Combinational logic circuit 60 generates read state transition signal READP1 in response to the signal from the corresponding latch circuit 54. Combinational logic circuit 62 generates write state transition signal WRITEP1 in response to the signal from the corresponding latch circuit 54.

It should be understood that combinational logic circuits 60 and 62 commonly receive a column termination signal COLTERMP 1, which will be described in detail later in conjunction with a fifth embodiment.

Figure 13:
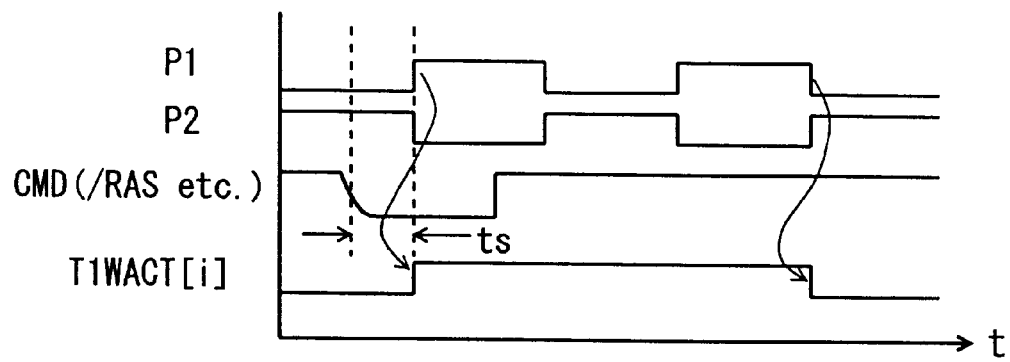
FIG. 13 is a timing diagram illustrating an operation of the synchronous circuit shown in FIG. 12.

As explained above, active command decoder 46 is provided before latch circuit 44 to directly receive external control signals /RAS, /CAS, /WE and /CS. Therefore, as shown in the timing diagram of FIG. 13, decoding of the active command by command decoder 46 is completed within the set-up period ts before the rise of internal clock signal P1. Accordingly, signal I1WACT [i] (i=1 to 3) rises immediately after internal clock signal P1 rises.

Likewise, precharge command decoder 48 is provided before latch circuit 44, and directly receives external control signals /RAS, /CAS, /WE and /CS. Therefore, decoding of the precharge command by command decoder 48 is completed within the set-up period ts, and as a result, signal I1WPRE [i] rises immediately after the rise of internal clock signal P1.

Read command decoder 50 and write command decoder 52 are also provided before latch circuits 44, and thus, signals /COLPR1 and /COLWP1 rise immediately after the rise of internal clock signal P1.

Similarly, bank decoders 138, 140, 142 and 144 are provided before latch circuits 44. Accordingly, decoding of the bank addresses by bank decoders 138, 140, 142 and 144 are completed within the set-up period ts.

Figure 14:
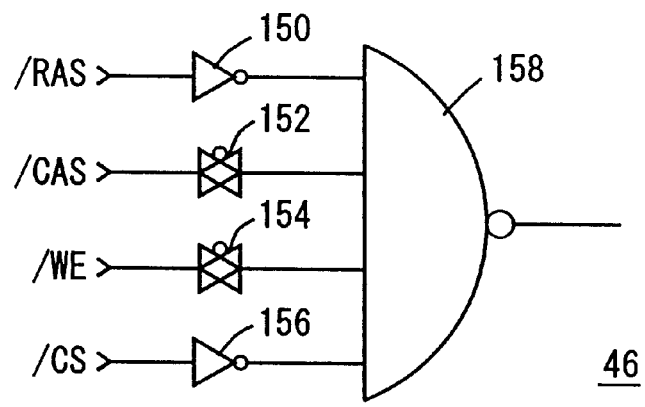
FIG. 14 is a circuit diagram showing a specific configuration of the command decoder shown in FIG. 12.

Preferably, active command decoder 46 includes, as shown in FIG. 14, an inverter 150 that receives /RAS signal, a CMOS transfer gate 152 that receives /CAS signal, a CMOS transfer gate 154 that receives /WE, an inverter 156 that receives /CS, and a 4-input NAND circuit 158 that receives output signals from inverters 150, 156 and transfer gates 152, 154.

Transfer gates 152 and 154 are not necessarily required because they transfer respective /CAS and /WE signals to NAND circuit 158 without changing their logic. However, provision of transfer gates 152 and 154 each having the same delay time as a respective inverter 150, 156 enables all the external control signals /RAS, /CAS, /WE and /CS to reach NAND circuit 158 at the same time.

Preferably, other command decoders 48, 50 and 52 are configured in the same manner as the active command decoder 46 described above. The places for insertion of the inverters and the transfer gates, however, are different for each command decoder 48, 50 or 52.

Figure 15:
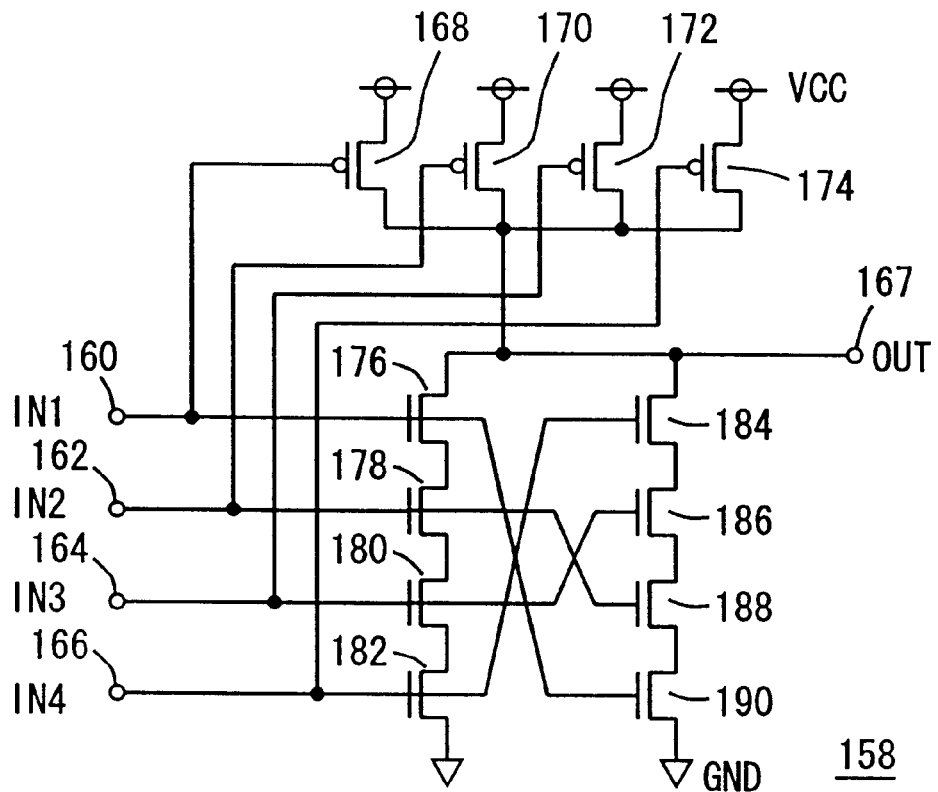
FIG. 15 is a circuit diagram showing a specific configuration of the 4-input NAND circuit shown in FIG. 14.

As shown in FIG. 15, 4-input NAND circuit 158 preferably includes: four input nodes 160, 162, 164 and 166; an output node 167; four P channel MOS transistors 168, 170, 172 and 174 connected in parallel with one another; four N channel MOS transistors 176, 178, 180 and 182 connected in series with one another; and four N channel MOS transistors 184, 186, 188 and 190 connected in series with one another.

N channel MOS transistors 168, 170, 172 and 174 each have a source connected to a power supply node, a drain connected to output node 167, and a gate connected to respective input nodes 160, 162, 164 and 166. N channel MOS transistors 176, 178, 180 and 182 are connected between output node 176 and a ground node, and each have its gate connected to input nodes 160, 162, 164 and 166, respectively. N channel MOS transistors 184, 186, 188 and 190 are connected between output node 167 and a ground node, i.e., connected in parallel with N channel MOS transistors 176, 178, 180 and 182. The gate of N channel MOS transistor 184 and the gate of N channel MOS transistor 182 are commonly connected to input node 166. The gates of N channel MOS transistors 186 and 180 are commonly connected to input node 164. The gates of N channel MOS transistors 188 and 178 are commonly connected to input node 162. The gates of N channel MOS transistors 190 and 176 are commonly connected to input node 160.

With such a configuration, 4-input NAND circuit 158 can generate an output signal with the same response time regardless of which input signal being applied to which input node.

Figure 16:
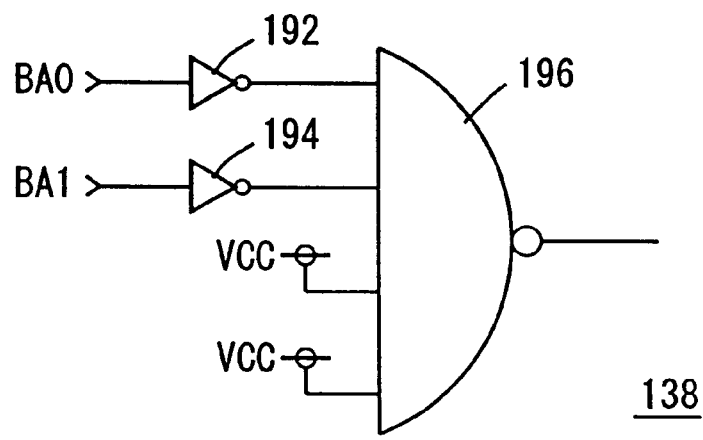
FIG. 16 is a circuit diagram showing a specific configuration of the bank decoder shown in FIG. 12.

Bank decoder 138 preferably includes, as shown in FIG. 16, an inverter 192 receiving bank address signal BA0, an inverter 194 receiving bank address signal BA1, and a 4-input NAND circuit 196 receiving output signals from inverters 192 and 194, as well as power supply voltages VCC.

NAND circuit 196 does not necessarily need to be configured with a 4-input NAND circuit, since NAND circuit 196 has two out of the four input nodes that receive power supply voltages VCC. Alternatively, it can be formed of a 2-input NAND circuit. Command decoders 46, 48, 50 and 52, however, all include 4-input NAND circuits. Thus, it is more convenient to have bank decoders 138, 140, 142 and 144 configured with 4-input NAND circuits, to time the input signals.

Though other bank decoders 140, 142 and 144 have basically the same configurations as bank decoder 138, the number of inverters to be connected to input nodes, or the number of input nodes to which power supply voltage VCC is to be applied are different for each bank decoder 140, 142, 144. In addition, it is desirable that a CMOS transfer gate is connected to an input node to which bank address signal BA0 or BA1 is directly provided, not via an inverter, so as to time the input signals as in the configuration shown in FIG. 14.

Fourth Embodiment

In synchronous circuit 40 shown in FIG. 12, signal I1WPRE [i] generated in response to the externally supplied precharge command is provided to combinational logic circuit 56. Active state transition signal RASP1 [i] generated by combinational logic circuit 56 must be kept at the H level for a plurality of cycles unless signal I1WPRE [i] is provided.

In the case where the external command is provided with a set-up period that is shorter than the normal set-up period, however, signal I1WPRE [i] may be generated illegally. Once the active state transition signal RASP1 [i] is reset in response to such an illegal signal I1WPRE [i], it will no longer return to its normal state.

Other than the precharge decode signal I1WPRE [i], a burst end signal that is generated by the combinational logic circuit for auto-precharge after burst read or burst write can also be used to reset active state transition signal RASP1 [i]. Since the precharge decode signal I1WPRE [i] is an external reset signal, it may encounter the illegal noise as described above. The burst end signal, however, is an internal reset signal, and thus, it will not suffer any illegal noise.

Figure 17:
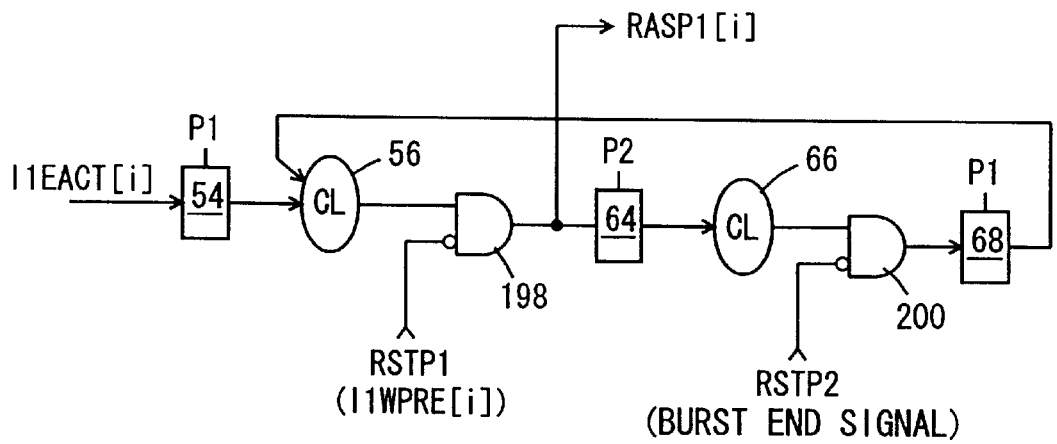
FIG. 17 is a circuit diagram showing an example of the main portion of a synchronous circuit according to a fourth embodiment of the present invention.

Thus, in the fourth embodiment, as shown in FIG. 17, a logic circuit 198 is provided between combinational logic circuit 56 and latch circuit 64, and further, a logic circuit 200 is provided between combinational logic circuit 66 and latch circuit 68. Logic circuit 198 receives precharge decode signal I1WPRE [i] as an external reset signal RSTP1. Logic circuit 200 receives the burst end signal as an internal reset signal RSTP2. Therefore, although active state transition signal RASP1 [i] is directly reset in response to external reset signal RSTP1, the auto-precharge signal from combinational logic circuit 66 is reset in response to internal reset signal RSTP2.

Figure 18:
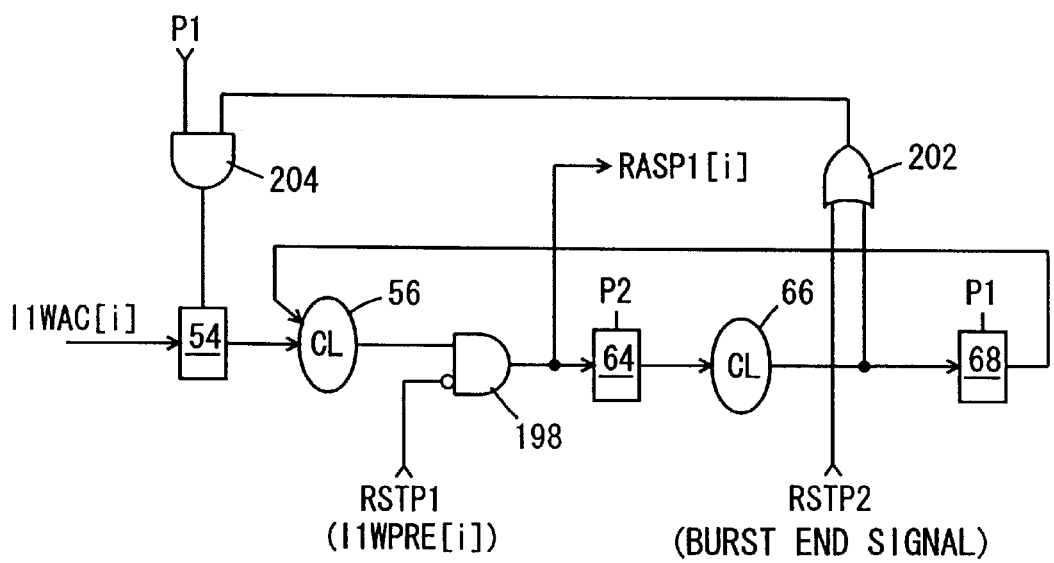
FIG. 18 is a circuit diagram showing another example of the main portion of the synchronous circuit according to the fourth embodiment.

Alternatively, as shown in FIG. 18, an OR circuit 202 and an AND circuit 204 may be provided instead of the logic circuit 200. OR circuit 202 receives the auto-precharge signal from combinational logic circuit 66 and the burst end signal as internal reset signal RSTP2. AND circuit 204 receives an output signal from OR circuit 202 and internal clock signal P1. Latch circuit 54 latches active decode signal I1WACT [i] in response to an output signal from AND circuit 204.

As in the case described above, active state transition signal RASP1 [i] is directly reset in response to external reset signal RSTP1. During the time when active state transition signal RASP1 [i] is kept at the H level, the output signal of AND circuit 204 is fixed at the L level. Thus, active state transition signal RASP1 [i] can be kept at the H level. When internal reset signal RSTP2 rises to the H level, however, internal clock signal P1 is supplied to latch circuit 54 to reset active state transition signal RASP1 [i].

Now, the operation of the circuits shown in FIGS. 17 and 18 will be described with reference to the timing diagrams shown in FIGS. 19 and 20.

Figure 19:
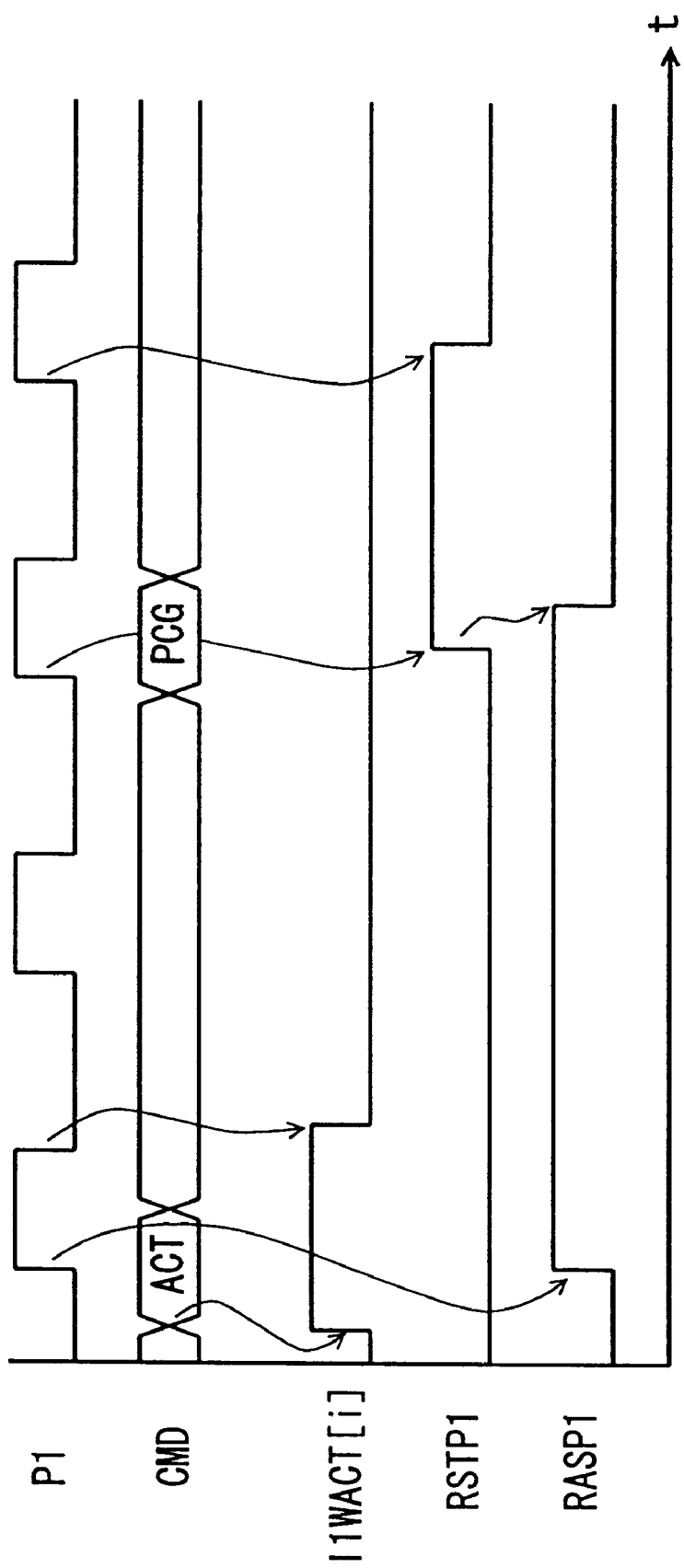
FIG. 19 is a timing diagram illustrating an operation associated with an external reset signal of the circuit shown in FIGS. 17 and 18.

FIG. 19 illustrates the operation in the case where active state transition signal RASP1 [i] is to be reset in response to external reset signal RSTP1. FIG. 20 illustrates the operation when active state transition signal RASP1 is to be reset in response to internal reset signal RSTP2.

As shown in FIG. 19, when active command ACT is externally supplied, active decode signal I1WACT [i] from NOR circuit 146 shown in FIG. 12 rises. Thereafter, active state transition signal RASP1 rises in response to the rise of internal clock signal P1. At the fall of internal clock signal P1, i.e., when internal clock signal P2 rises, active decode signal I1WACT [i] falls, but active state transition signal RASP1 is kept at the H level. Thereafter, precharge command PCG is externally supplied. Then, in response to the rise of internal clock signal P1, external reset signal RSTP1 (i.e., I1WPRE [i]) rises. As this external reset signal RSTP1 is applied to logic circuit 198 shown in FIGS. 17 and 18, active state transition signal RASP1 is reset.

Figure 20:
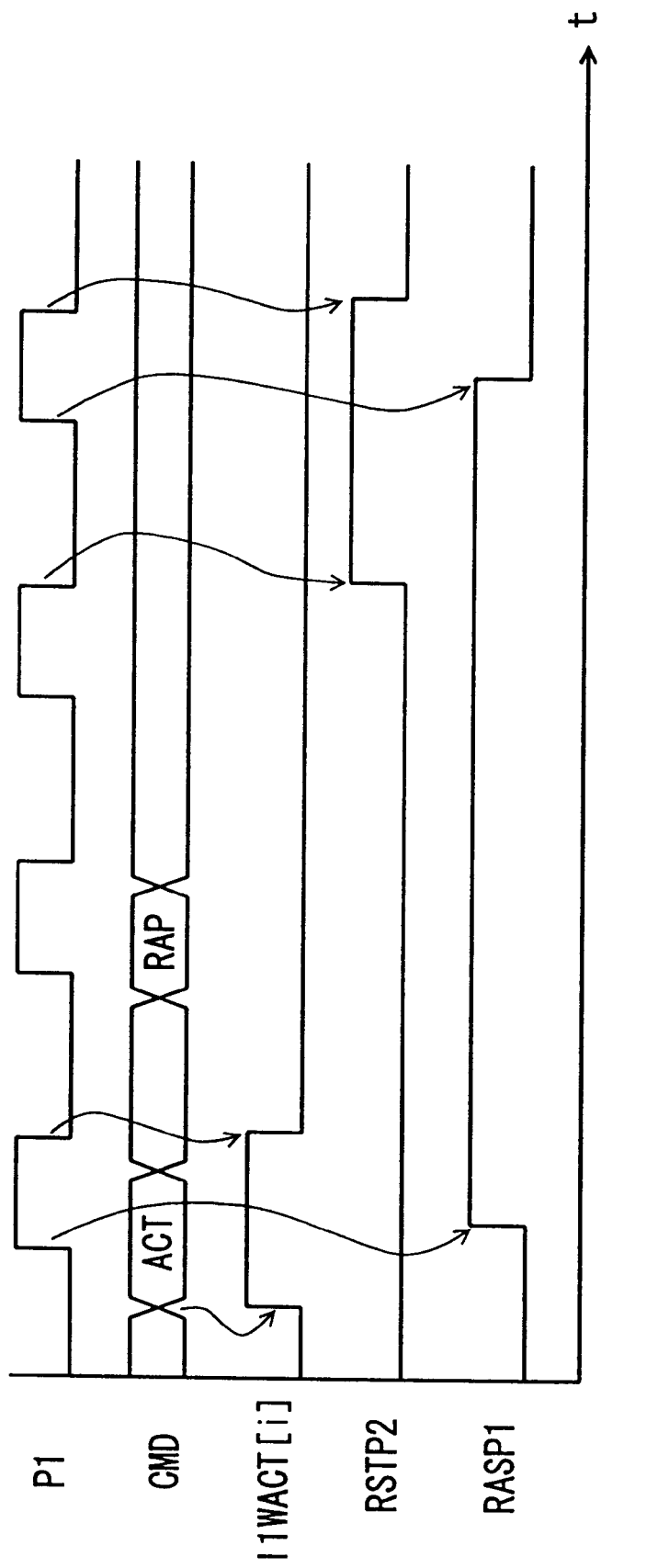
FIG. 20 is a timing diagram illustrating an operation associated with an internal reset signal of the circuit shown in FIGS. 17 and 18.

FIG. 20 shows the case where a read auto-precharge signal is input with a burst length of "2".

Referring to FIG. 20, active command ACT has been provided and thus active state transition signal RASP1 is being kept at the H level. If auto-precharge read command RAP is provided at this time, RSTP2 rises a half cycle before the burst end in response to the rise of internal clock signal P2. Because of this signal, active state transition signal RASP1 falls at the rise of P1.

As explained above, according to the fourth embodiment, the reset path is divided into two paths: the external one and the internal one. As a result, even if an external command is illegally input with respect to the normal set-up period, erroneous reset of active state transition signal RASP1 can be prevented.

In the circuit shown in FIG. 17, a spike noise may be created due to the racing between latch circuits 54 and 68, at the beginning of the second cycle after active state transition signal RASP1 attained the H level. The output of latch circuit 54 goes from the H level to the L level at the second cycle. The output of latch circuit 68, which is for holding the state of active state transition signal RASP1 [i] after the second cycle, goes from the L level to the H level at the beginning of the second cycle. Here, if the outputs of both latch circuits 54 and 68 attain the L level simultaneously even for an instant, the spike noise will be created in active state transition signal RASP1. Since the row-related internal control signals are generated with respect to the rising or falling edge of active state transition signal RASP1, such a spike noise may cause malfunction.

Figure 21:
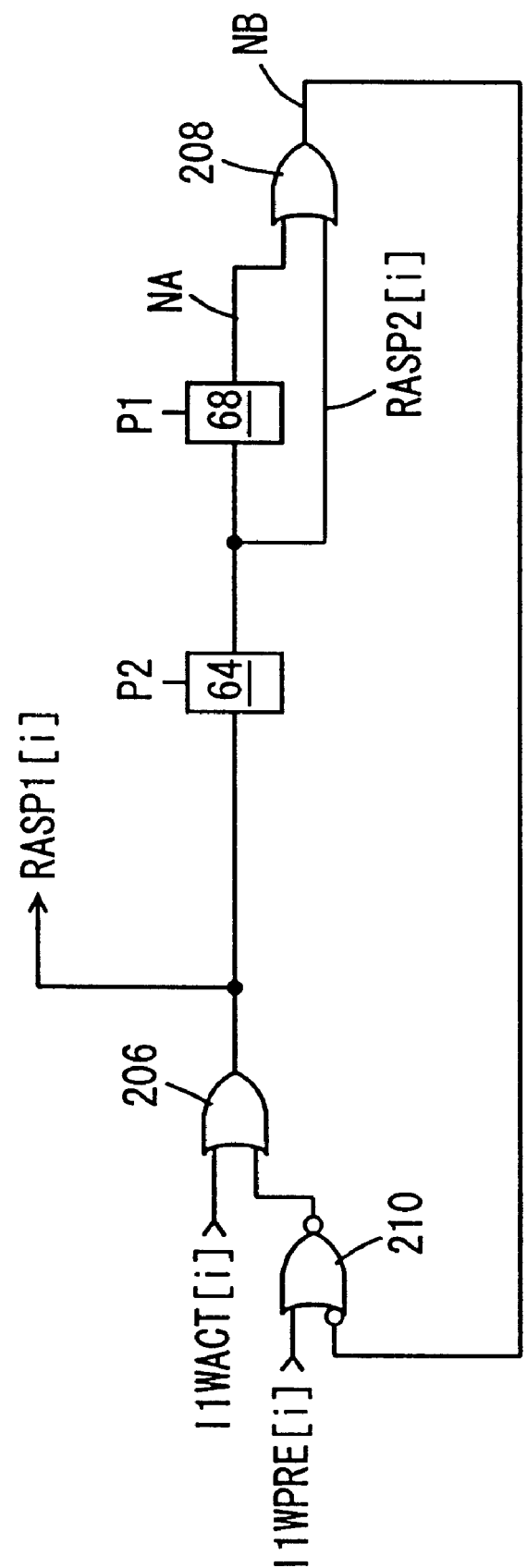
FIG. 21 is a circuit diagram showing a still another example of the main portion of the synchronous circuit according to the fourth embodiment.

Thus, to prevent the spike noise, it is preferred to modify the circuit shown in FIG. 17 to that of FIG. 21. The circuit shown in FIG. 21 is provided with an OR circuit 206 that receives active decode signal I1WACT [i] from latch circuit 54, an OR circuit 208 that receives output signals from latch circuits 64 and 68, and an NOR circuit 210 that receives an output signal from OR circuit 208 and precharge decode signal I1WPRE [i] from latch circuit 54 shown in FIG. 12. The output signal from NOR circuit 210 is provided to OR circuit 206. These OR circuits 206, 208 and NOR circuit 210 are included in combinational logic circuit 56.

Figure 22:
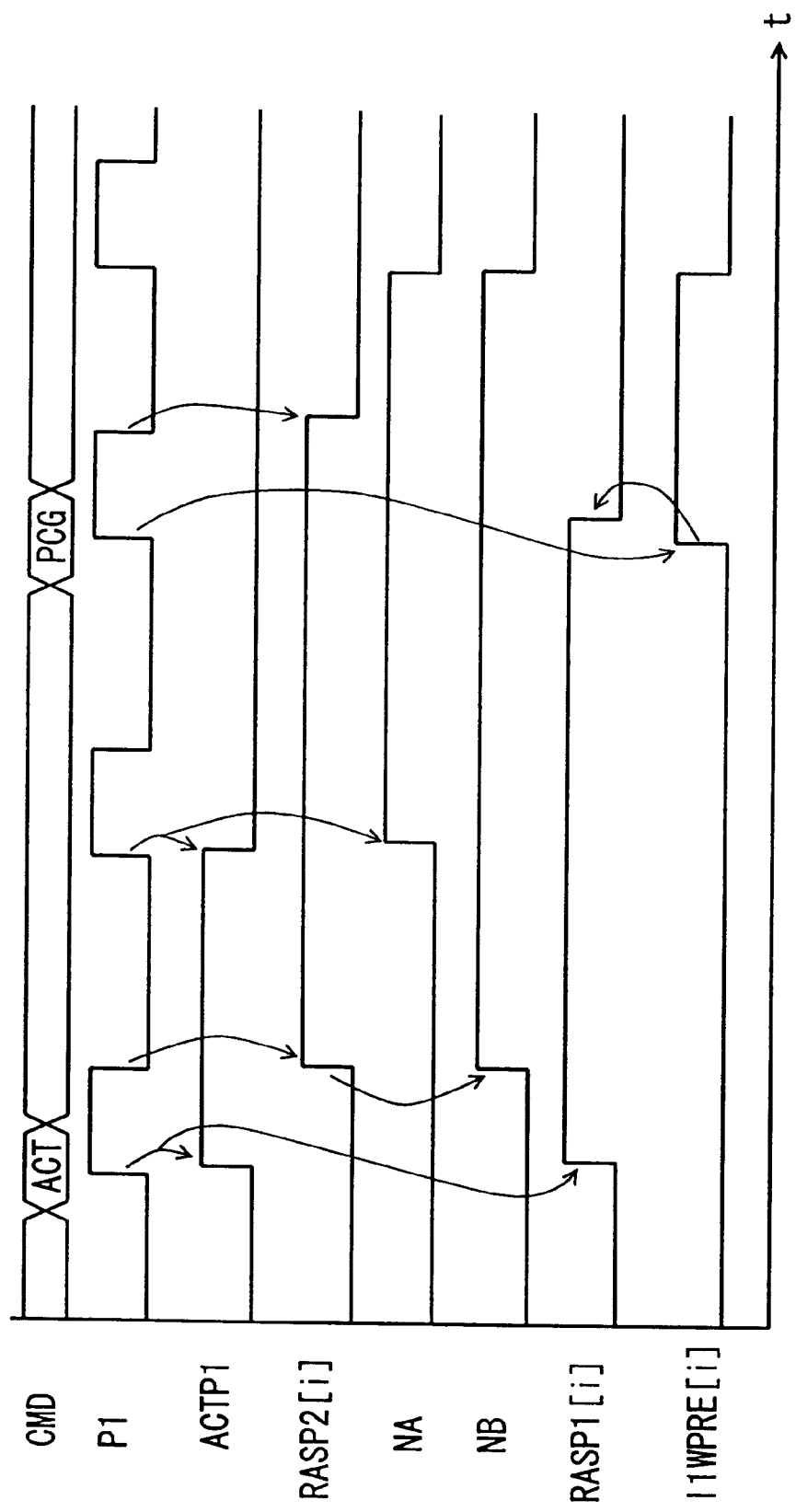
FIG. 22 is a timing diagram illustrating an operation of the circuit shown in FIG. 21.

The operation of this circuit will now be described with reference to the timing diagram shown in FIG. 22.

As described above, active state transition signal RASP1 rises after the input of active command ACT, in response to the rising edge of internal clock signal P1. Since latch circuit 64 latches this active state transition signal RASP1 [i] in response to internal clock signal P2, active state transition signal RASP2 [i] output from this latch circuit 64 is generated a half cycle behind the active state transition signal RASP1 [i]. The voltage at an output node NB of OR circuit 208 attains an H level in response to the rising edge of active state transition signal RASP2 [i]. The voltage at an output node NA of latch circuit 68 attains an H level in response to the rising edge of the second cycle of internal clock signal P1. Here, even if the rising of this node NA is somewhat delayed, the logic level of node NB is already decided a half cycle earlier than its rising, and therefore, active state transition signal RASP1 will not suffer the spike noise as described above.

Fifth Embodiment

Normally in an SDRAM, external control signals may be compared with state transition signals, and the results of comparison may control its operation. For example, the operation of the column system can be interrupted by an externally supplied precharge command. More specifically, when a bank in which the column system is in operation receives a precharge command, the operation of the column system in the bank is interrupted to start precharging. On the other hand, if the precharge command is given to a bank other than the one in which the column system is in operation, the operation of the column system is not interrupted, and automatic precharging will start in due course.

An object of the fifth embodiment of the present invention is to increase the operating speed by performing comparison between external control signals and state transition signals during the set-up period for receiving the external control signals, as in the case of the command decoding according to the third embodiment described above.

Figure 23:
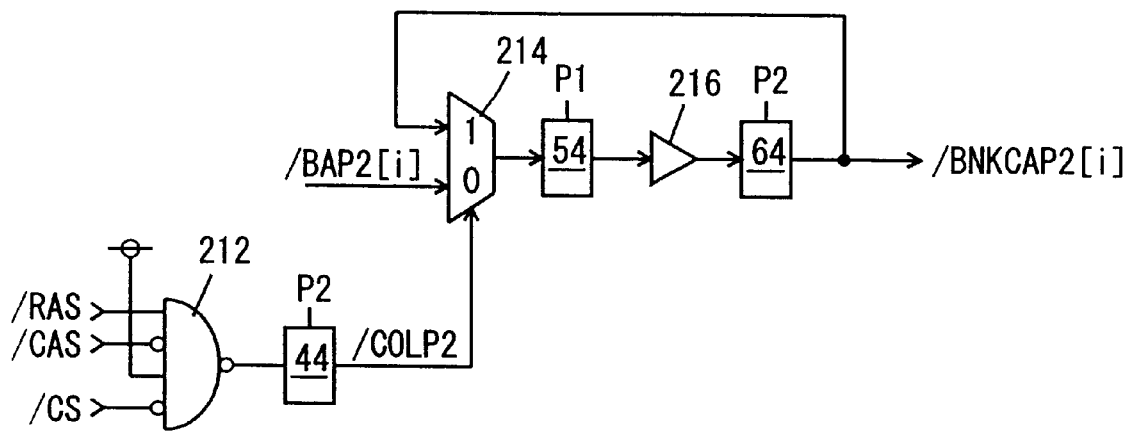
FIG. 23 is a circuit diagram showing a portion of a synchronous circuit according to a fifth embodiment of the present invention.

As shown in FIG. 23, in addition to the components shown in FIG. 12, synchronous circuit 40 according to the fifth embodiment includes: a read/write command decoder 212; a latch circuit 44 that latches the decode signal from decoder 212 in response to internal clock signal P2; a multiplexer 214 that selects either a bank column activation signal BNKCAP2 [i] indicating the bank in which the column system is in operation or a bank decode signal /BAP2 [i] from latch circuit 44 of FIG. 12, in response to a column decode signal /COLP2 latched at latch circuit 44; a latch circuit 54 that latches a signal from multiplexer 214 in response to internal clock signal P1; a buffer 216 that receives a signal from latch circuit 54; and a latch circuit 64 that latches a signal from buffer 216 in response to internal clock signal P2 and outputs the signal as bank column activation signal /BNKCAP2 [i]. Here, multiplexer 214, latch circuit 54, buffer 216 and latch circuit 64 are provided for each bank. Read/write command decoder 212 outputs a decode signal at an L level when the read command or the write command is provided. Multiplexer 214 selects bank decode signal /BAP2 [i] when column decode signal /COLP2 is at the L level, i.e., when it receives the read/write command, and selects bank column activation signal /BNKCAP2 [i] when column decode signal /COLP2 is at the H level.

Figure 24:
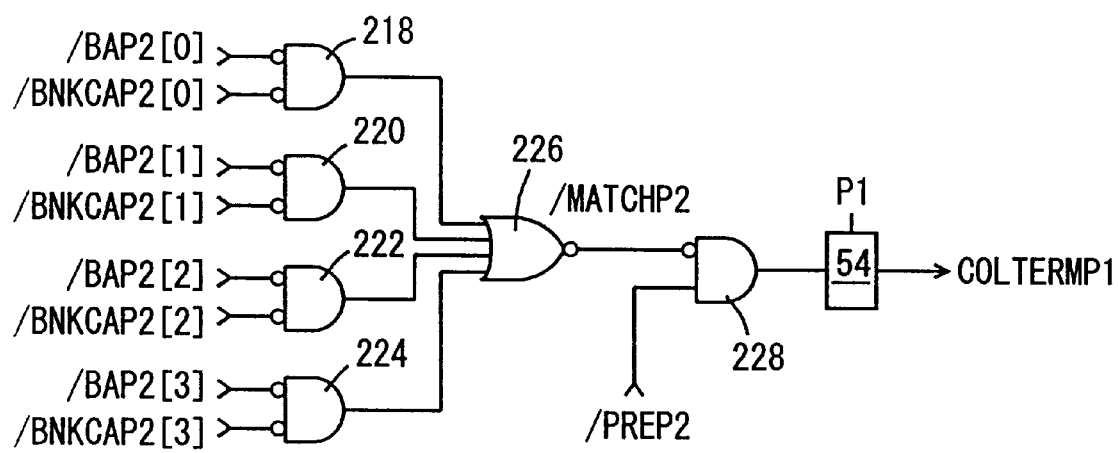
FIG. 24 is a circuit diagram showing another portion of the synchronous circuit according to the fifth embodiment.

As shown in FIG. 24, synchronous circuit 40 further includes: NOR circuits (negative logic) 218, 220, 222 and 224 that receive bank decode signals /BAP2 [0] to [3] from latch circuits 44 shown in FIG. 12 and bank column activation signals /BNKCAP2 [0] to [3] from latch circuits 64 shown in FIG. 23, respectively; an NOR circuit 226 that receives output signals from NOR circuits 218, 220, 222 and 224; an AND circuit 228 that receives a match signal /MATCHP2 from NOR circuit 226 and precharge decode signal /PREP2 from latch circuit 44 shown in FIG. 12; and a latch circuit 54 that latches an output signal from AND circuit 228 in response to internal clock signal P1 and outputs the signal as column termination signal COLTERMP1. Here, NOR circuits 218, 220,222, 224 and NOR circuit 226 constitute a comparison circuit that activates the match signal /MATCHP2 to the L level when any one of the bank column activation signals /BNKCAP2 [i] matches the corresponding bank decode signal /BAP2 [i]. Column termination signal COLTERMP1 is applied to combinational logic circuits 60 and 62 shown in FIG. 12.

Figure 25:
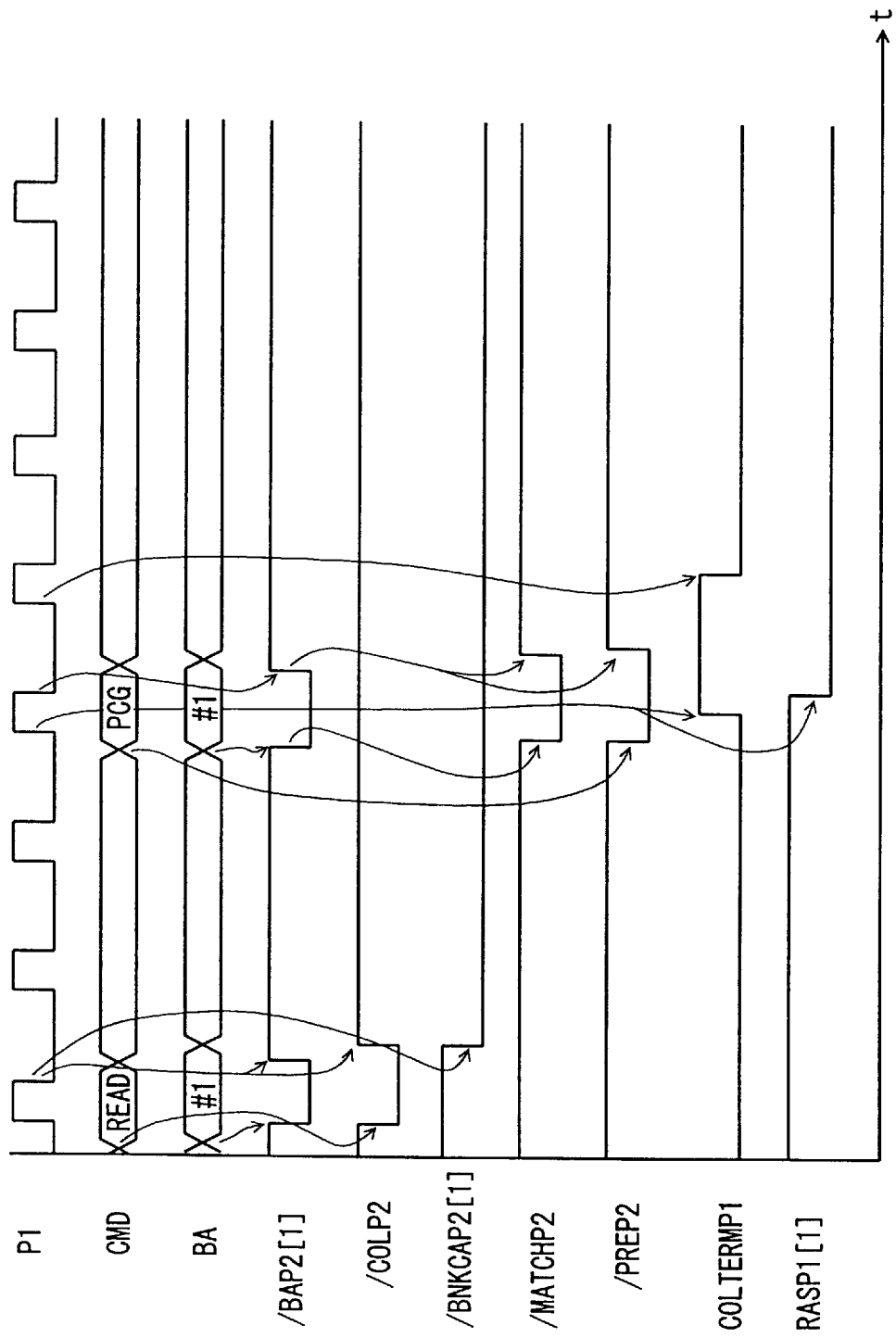
FIG. 25 is a timing diagram illustrating an operation of the synchronous circuit shown in FIGS. 23 and 24.

The operation of synchronous circuit 40 having the above-described configuration will now be described with reference to the timing diagram shown in FIG. 25. Here, it is assumed that bank #1 receives a precharge command while the column system in the bank #1 is performing a reading operation.

When read command READ is externally supplied and internal clock signal P2 rises, i.e., internal clock signal P1 falls, column decode signal /COLP2 falls to the L level.

On the other hand, if bank address signal BA0 at the H level and bank address signal BA1 at the L level are supplied to select bank #1 and internal clock signal P2 rises, i.e., internal clock signal P1 falls, then bank decode signal /BAP2 [1] falls to the L level.

Since column decode signal /COLP2 is at the L level as described above, bank decode signal /BAP2 [1] is selected by multiplexer 214 and is supplied to latch circuit 54. Thus, bank column activation signal /BNKCAP2 falls to the L level in response to the rise of internal clock signal P2, i.e., the fall of internal clock signal P1.

As described above, in the case where precharge command PCG for bank #1 is externally supplied while the column system in the bank #1 is in the read mode, bank decode signal /BAP2 [1] falls to the L level in response to the rise of internal clock signal P2, i.e., the fall of internal clock signal P1. At this time, bank decode signal /BAP2 [1] and bank column activation signal /BNKCAP2 [1] are both at the L level, and thus, match signal /MATCHP2 falls to the L level. Since precharge command PCG is provided, precharge decode signal /PREP2 is at the L level. Accordingly, column termination signal COLTERMP1 rises to the H level in response to the rise of internal clock signal P1. Because of the presence of precharge command PCG, active state transition signal RASP1 [1] falls to the L level.

The column termination signal COLTERMP1 at the H level is applied to combinational logic circuits 60 and 62 shown in FIG. 12, and thus, read state transition signal READP1 attains the L level. Accordingly, the read operation of the column system in bank #1 is interrupted.

Note that, if precharge command PCG is supplied to the other banks, column termination signal COLTERMP1 is held at the L level, and active state transition signals RASP1 [0], [2] and [3] for the other banks each attain the L level.

As explained above, according to the fifth embodiment, comparison of bank decode signals /BAP2 [0] to [3] and bank column activation signals /BNKCAP2 [0] to [3] is performed during the set-up period for receiving external signals. Thus, the operating speed can be improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous semiconductor memory device that receives a plurality of external control signals in synchronization with a clock signal and makes transition among a plurality of operating states in response to the external control signals received, comprising:

a memory cell array;

a read/write circuit reading data from and writing data to said memory cell array; and a control signal generator generating and supplying to said read/write circuit, an internal control signal for control of said read/write circuit;

said control signal generator including a synchronous circuit synchronous with said clock signal and responsive to said external control signals for generating a plurality of state transition signals indicating said plurality of operating states, respectively, and a timing adjustment circuit asynchronous to said clock signal and responsive to said state transition signals for generating said internal control signal.

2. The synchronous semiconductor memory device according to claim 1, wherein said timing adjustment circuit delays a rising edge and/or a falling edge of said state transition signal to define a rising edge and/or a falling edge of said internal control signal.

3. The synchronous semiconductor memory device according to claim 1, further comprising:
a 2-phase clock generator responsive to said clock signal for generating first and second clock signals complementary to each other;
said synchronous circuit activating and thus generating one of said state transition signals when said first clock signal goes from a first logic level to a second logic level, and activating and thus generating another one of said state transition signals when said second clock signal goes from the first logic level to the second logic level, said another one state transition signal being behind said one state transition signal by a half cycle of said first and second clock signals.

4. The synchronous semiconductor memory device according to claim 3, wherein said timing adjustment circuit includes
an OR circuit responsive to said one state transition signal and said another one state transition signal for generating said internal control signal.

5. The synchronous semiconductor memory device according to claim 3, wherein said timing adjustment circuit includes
an AND circuit responsive to said first or second clock signal and said another one state transition signal for generating said internal control signal.

6. The synchronous semiconductor memory device according to claim 1, further comprising:
a 2-phase clock generator responsive to said clock signal for generating first and second clock signals complementary to each other;
said synchronous circuit including
a first latch circuit responsive to said second clock signal for latching said external control signal,
a command decoder decoding the signal latched at said first latch circuit,
a second latch circuit responsive to said first clock signal for latching a signal from said command decoder, and
a logic circuit responsive to the signal latched at said second latch circuit for generating said state transition signal.

7. The synchronous semiconductor memory device according to claim 1, further comprising:
a 2-phase clock generator responsive to said clock signal for generating first and second clock signals complementary to each other;
said synchronous circuit including
a command decoder receiving and decoding said external control signal, and
a first latch circuit responsive to said second clock signal for latching a signal from said command decoder.

8. The synchronous semiconductor memory device according to claim 7, wherein said command decoder includes
an inverter receiving one of said external control signals,
a transfer gate receiving another one of said external control signals, and
a NAND circuit receiving output signals from said inverter and said transfer gate.

9. The synchronous semiconductor memory device according to claim 8, wherein said NAND circuit includes
a first input node,
a second input node,
an output node,
a first P channel MOS transistor having a gate connected to said first input node, a source connected to a power supply node, and a drain connected to said output node,
a second P channel MOS transistor having a gate connected to said second input node, a source connected to a power supply node, and a drain connected to said output node,
a first N channel MOS transistor having a gate connected to said first input node, a source, and a drain connected to said output node,
a second N channel MOS transistor having a gate connected to said second input node, a source connected to a ground node, and a drain connected to the source of said first N channel MOS transistor,
a third N channel MOS transistor having a gate connected to said second input node, a source, and a drain connected to said output node, and
a fourth N channel MOS transistor having a gate connected to said first input node, a source connected to a ground node, and a drain connected to the source of said third N channel MOS transistor.

10. The synchronous semiconductor memory device according to claim 7, wherein said memory cell array is divided into a plurality of banks,
said synchronous circuit further including
a bank decoder receiving and decoding a bank address signal for identifying said banks,
a second latch circuit responsive to said second clock signal for latching a signal from said bank decoder,
a logic circuit responsive to the signals latched at said first and second latch circuits for outputting a signal, and
a third latch circuit responsive to said first clock signal for latching the signal from said logic circuit.

11. The synchronous semiconductor memory device according to claim 10, wherein
said command decoder includes a first NAND circuit having a plurality of input nodes, and
said bank decoder includes a second NAND circuit having the same number of input nodes as said first NAND circuit.

12. The synchronous semiconductor memory device according to claim 1, wherein
said synchronous circuit includes
a first command decoder decoding said external control signals,
a first logic circuit responsive to a signal from said first command decoder for generating one of said state transition signals that holds an active state over a plurality of cycles of said clock signal,
a second logic circuit responsive to the state transition signal from said first logic circuit for generating and supplying to said first logic circuit a first reset signal for causing the state transition signal to enter an inactive state,
a second command decoder decoding said external control signals and generating a second reset signal for causing the state transition signal from said first logic circuit to attain an inactive state, and
a gate circuit connected between said first and second logic circuits, responsive to said second reset signal for causing the state transition signal from said first logic circuit to attain an inactive state.

13. The synchronous semiconductor memory device according to claim 1, wherein said synchronous circuit includes
- a decoder decoding an external signal, and
- a comparison circuit comparing a signal from said decoder with said state transition signal.

14. The synchronous semiconductor memory device according to claim 1, wherein said memory cell array is divided into a plurality of banks, said synchronous circuit including
- a bank decoder decoding a bank address signal to identify said banks,
- a bank column activation circuit responsive to a signal from said bank decoder for generating a bank column activation signal indicating, among said plurality of banks, a bank having its column circuitry being in operation,
- a comparison circuit comparing the signal from said bank decoder with said bank column activation signal,
- a precharge command decoder decoding said external control signal, and
- a column termination circuit responsive to a match signal from said comparison circuit and a signal from said precharge command decoder for generating a column termination signal to terminate the operation of said column circuitry.

15. A semiconductor memory device producing a plurality of operating states in response to a clock signal and a plurality of external control signals, comprising:

a memory cell array;

a read circuit reading data from said memory cell array; and a control generator supplying an internal control signal for control of said read circuit;

said control generator receiving a signal generated in response to said external control signals, and said control generator including at least two signal holding units controlled by an internal clock signal generated in response to said clock signal, a circuit generating a plurality of state transition signals that are generated in response to outputs of said signal holding units and indicate, respectively, said plurality of operating states, and a timing adjustment circuit receiving said plurality of state transition signals, at least two of said state transition signals producing delays different from each other, and generating said internal control signal.

16. A semiconductor memory device producing a plurality of operating states in response to a clock signal and a plurality of external control signals, comprising:

a memory cell array;

a write circuit writing data to said memory cell array; and a control generator supplying an internal control signal for control of said write circuit;

said control generator receiving a signal generated in response to said external control signals, and said control generator including at least two signal holding units controlled by an internal clock signal generated in response to said clock signal, a circuit generating a plurality of state transition signals that are generated in response to outputs of said signal holding units and indicate, respectively, said plurality of operating states, and a timing adjustment circuit receiving said plurality of state transition signals, at least two of said state transition signals producing delays different from each other, and generating said internal control signal.

* * * * *